(12) United States Patent
Xu et al.

(10) Patent No.: US 8,785,123 B2
(45) Date of Patent: Jul. 22, 2014

(54) DIRECT HIERARCHICAL ASSEMBLY OF NANOPARTICLES

(75) Inventors: Ting Xu, Berkeley, CA (US); Yue Zhao, Mountain View, CA (US); Kari Thorkelsson, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/502,362

(22) PCT Filed: Oct. 18, 2010

(86) PCT No.: PCT/US2010/053074
§ 371 (c)(1),
(2), (4) Date: Aug. 9, 2012

(87) PCT Pub. No.: WO2011/047386
PCT Pub. Date: Apr. 21, 2011

(65) Prior Publication Data
US 2012/0309904 A1    Dec. 6, 2012

Related U.S. Application Data

(60) Provisional application No. 61/252,711, filed on Oct. 18, 2009.

(51) Int. Cl.
*C12Q 1/68*   (2006.01)
*G01N 33/543*  (2006.01)
*G01N 33/53*   (2006.01)

(52) U.S. Cl.
USPC ............................................. 435/6.1; 435/7.1

(58) Field of Classification Search
USPC ........................................................ 435/6, 7.1
See application file for complete search history.

(56) References Cited

U.S. PATENT DOCUMENTS

| | | | |
|---|---|---|---|
| 7,297,290 B2 * | 11/2007 | Fuchs et al. | 252/62.54 |
| 2003/0077625 A1 | 4/2003 | Hutchison | |
| 2009/0053512 A1 | 2/2009 | Pyun et al. | |
| 2009/0191713 A1 | 7/2009 | Yoon et al. | |
| 2010/0148156 A1 * | 6/2010 | Jang et al. | 257/40 |

OTHER PUBLICATIONS

International Search Report and Written Opinion dated Dec. 16, 2010, issued in related International Patent Application No. PCT/US2010/053074, filed Oct. 18, 2010.

* cited by examiner

*Primary Examiner* — Nathan M Nutter
(74) *Attorney, Agent, or Firm* — Lawrence Berkeley National Laboratory

(57) ABSTRACT

The present invention provides hierarchical assemblies of a block copolymer, a bifunctional linking compound and a nanoparticle. The block copolymers form one micro-domain and the nanoparticles another micro-domain.

20 Claims, 25 Drawing Sheets

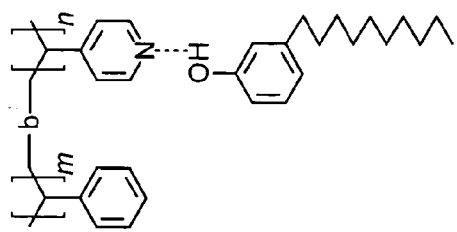
FIG. 2
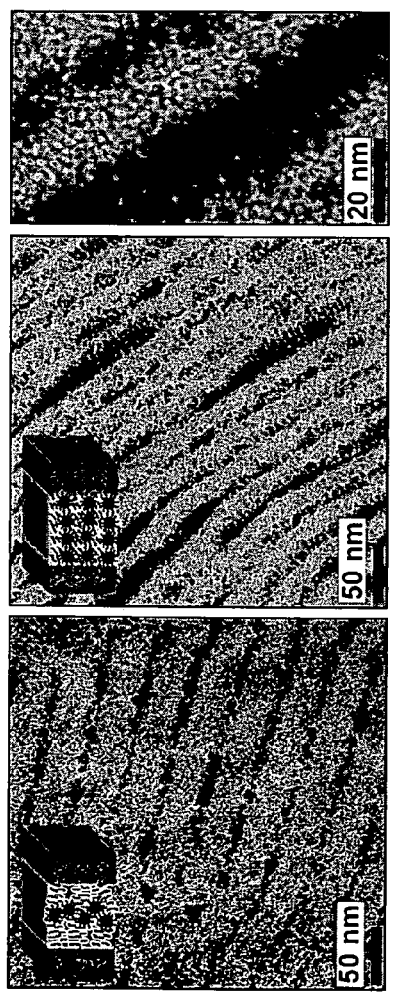
FIG. 3a
FIG. 3b
FIG. 3c
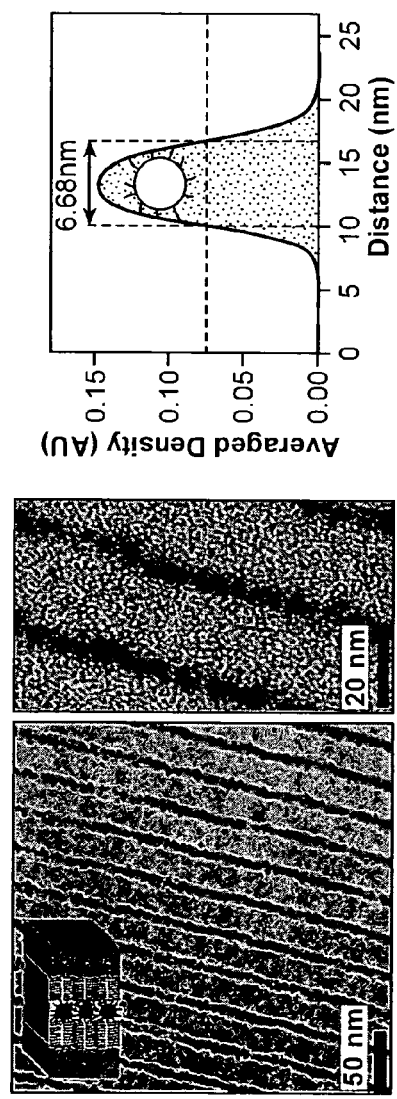
FIG. 3d
FIG. 3e
FIG. 3f

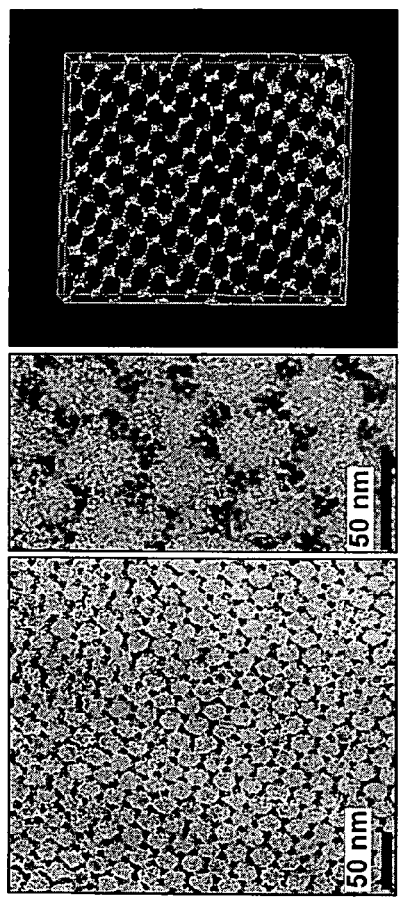
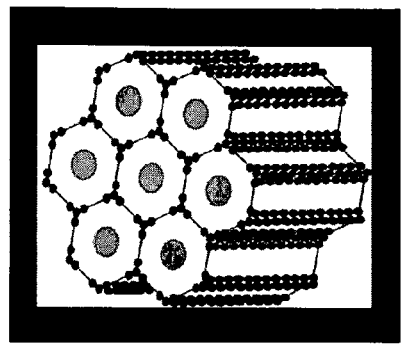
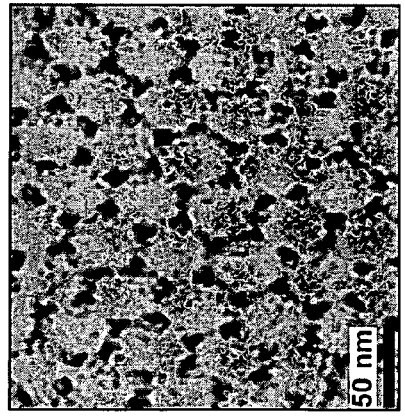
FIG. 4a
FIG. 4b
FIG. 4c
FIG. 4d
FIG. 4e

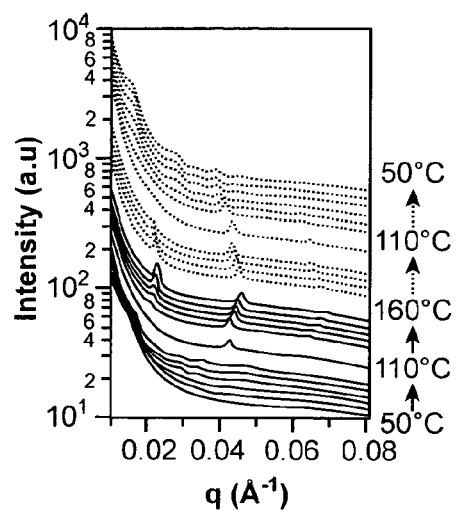
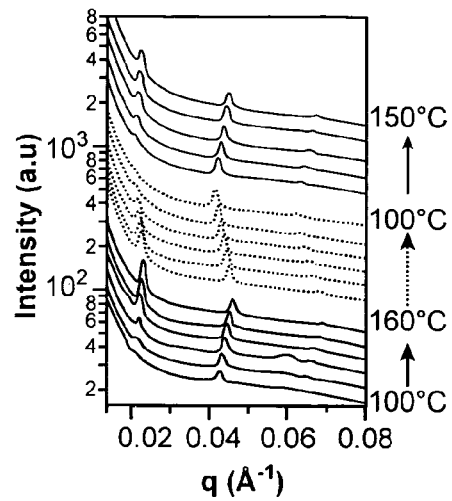
FIG. 5a    FIG. 5b
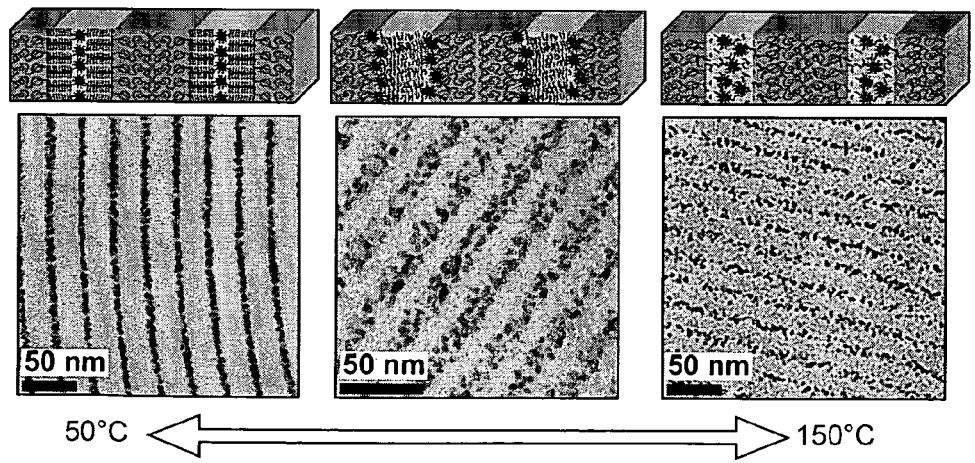
FIG. 5c    FIG. 5d    FIG. 5e

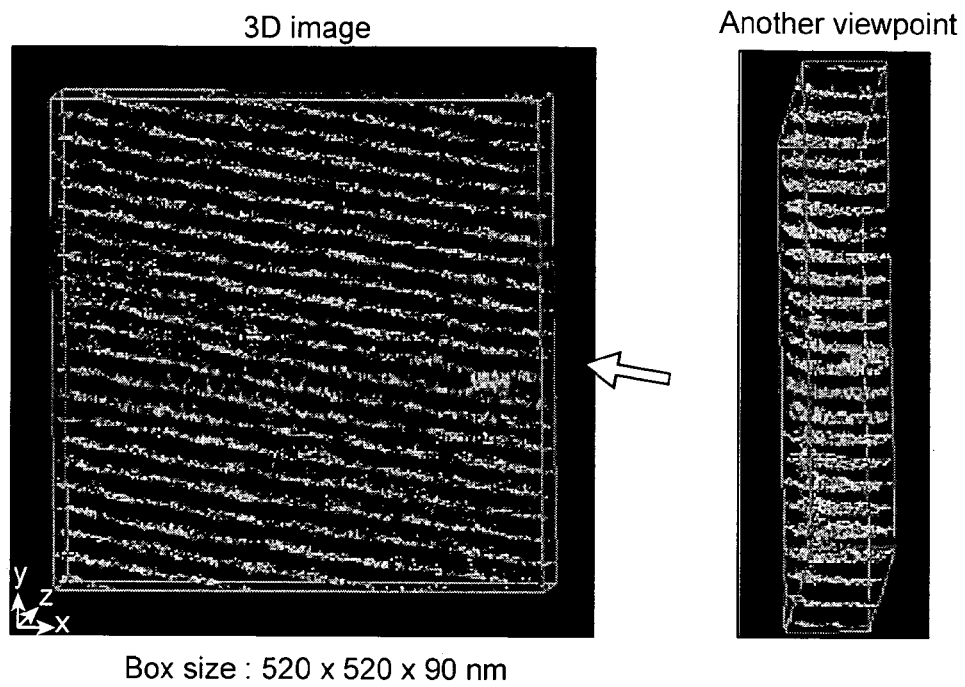
FIG. 17b
Box size : 520 x 520 x 90 nm
FIG. 17c
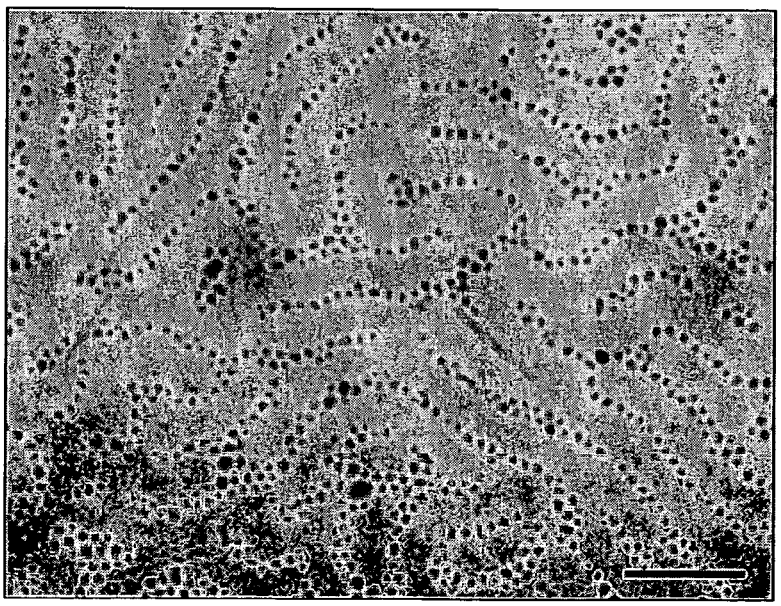
FIG. 18

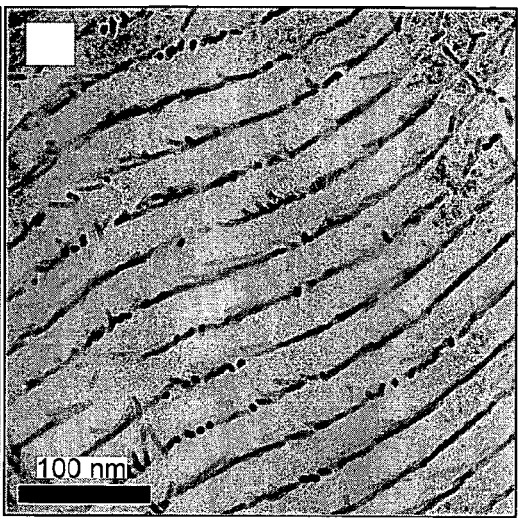
FIG. 28a  FIG. 28b
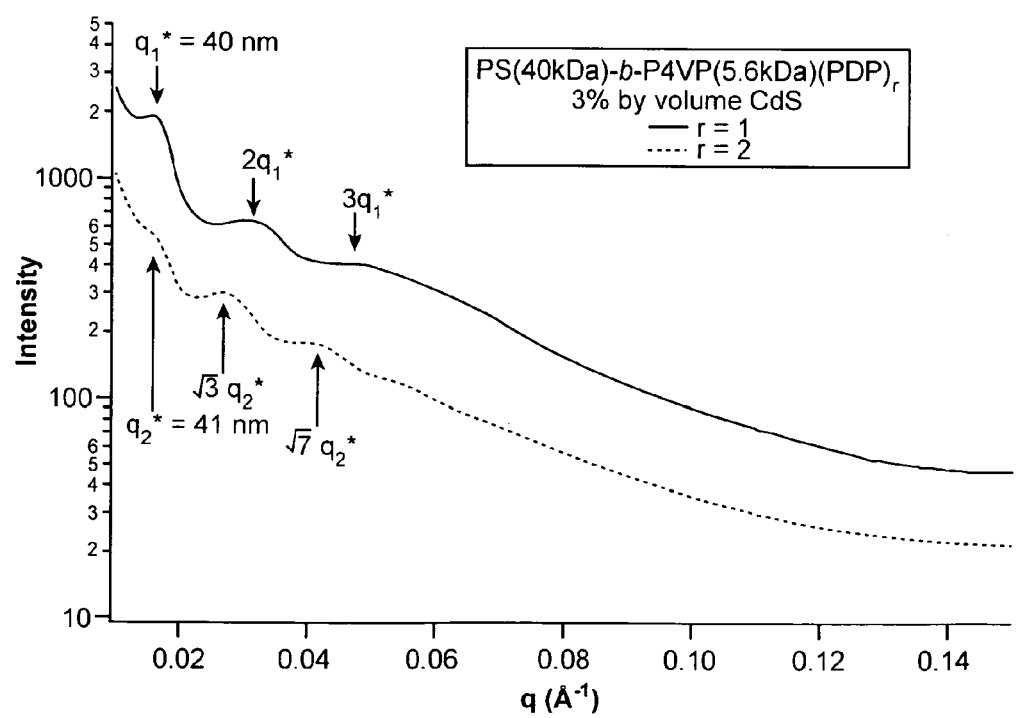
FIG. 29

US 8,785,123 B2

DIRECT HIERARCHICAL ASSEMBLY OF NANOPARTICLES

CROSS-REFERENCE TO RELATED APPLICATIONS

This present application is the U.S. National Stage entry under §371 of International Application No. PCT/US2010/053074, filed Oct. 18, 2010, which claims the benefit of U.S. Provisional Application No. 61/252,711, filed Oct. 18, 2009, which are incorporated in their entirety herein for all purposes.

STATEMENT AS TO RIGHTS TO INVENTIONS MADE UNDER FEDERALLY SPONSORED RESEARCH AND DEVELOPMENT

This invention was made with government support under Contract No. DE-AC02-05CH11231 awarded by the U.S. Department of Energy and under Grant No. W911NF-07-1-0653 awarded by the U.S. Department of Defense. The government has certain rights in this invention.

BACKGROUND OF THE INVENTION

Metal and semiconductor nanoparticles have shown great potential for various applications in the areas of photovoltaics, memory storage, and computing (Ref. 48). However, fine control of the nanoparticles' spatial distribution and macroscopic orientation is required to realize this potential. Indeed, to compete with preexisting technologies, this fine control must be exerted through a technique that is simple and efficient yet able to pattern the nanoparticles uniformly over large areas. Block copolymers (BCPs) have been used in attempts to achieve such control—one block can be tailored to have preferential interactions with certain nanoparticles. However, therein lies a significant problem—this method requires surface modification of the nanoparticles and specially designed polymers as well as precise control of both nanoparticle and polymer sizes and compositions. In addition, though this will cause nanoparticles to segregate to specific microdomains, there has been no success in controlling the inter-particle ordering within these microdomains—a factor critical to device performance. The ability to tailor such ordering and to arrange the particles within these microdomains via external stimuli is very desirable, but remains a significant challenge.

Facile control over the spatial distribution of nanoscopic building blocks, such as nanoparticles (NPs), from nanoscopic to macroscopic length scales, has been a major impediment in the "bottom-up" fabrication of functional materials. Precise manipulation of NP assemblies would enable one to capitalize on the plethora of available nanoparticles with unique optical, electronic or magnetic properties so as to generate functional devices, ranging from sensors and memory storage to photovoltaic, plasmonic and other microelectronic devices. Albeit challenging, additional control using external stimuli to direct the ordering and local environment of NPs, would be ideal for the design of responsive functional nanocomposites.

Various routes to direct NP assemblies have been explored, including the use of DNA and functional polymers. Programmable DNA linkers have been shown to be effective in obtaining nanoparticle arrays with tunable symmetry and dimensionality. However, large-scale fabrication poses a significant hurdle for many practical applications. Block copolymers (BCPs), on the other hand, self-assemble into well-defined arrays of nanostructures over macroscopic distances, presenting an ideal platform for directing the assembly of NPs. However, directing the NP assembly within BCP microdomains that are tens of nanometers in size and obtaining external stimuli-responsive nanocomposites still remains a challenge. BCP chains assume a stretched, random coil configuration and provide less control over the NP assembly, generally leading to a random distribution of NPs within the microdomains. Incorporating stimuli-responsiveness into a BCP without interfering with the NP assemblies can be synthetically challenging, making it non-trivial to generate responsive nanocomposites. Furthermore, using only BCPs to guide NP assemblies requires a delicate balance between the interactions of the NP-ligands and the segments of the BCPs and the entropic penalties arising from the perturbation of the BCP chain configuration. Modifying the ligands of the NPs to make them compatible with a specific BCP is possible, but usually requires synthetic procedures that are specific to each NP core and can be synthetically challenging. Perturbing the ligand shell in exchange reactions can also alter the properties of the NPs. What is needed is a mixture of block copolymer and nanoparticles with ligands where the block copolymers bind to the nanoparticles. Surprisingly, the present invention meets this and other needs.

BRIEF SUMMARY OF THE INVENTION

In one embodiment, the present invention provides a composition having a plurality of nanoparticles each having a ligand linked to a surface of the nanoparticle; a plurality of block copolymers each comprising a first block and a second block; and a bifunctional linking compound that non-covalently links to one block of one of the block copolymers and to the ligand on the surface of the nanoparticle, wherein the nanoparticles are arranged in an array to form a first microdomain, and the block copolymers form a second microdomain.

In another embodiment, the present invention provides a method of making a making a nanocomposite by forming a solution of a block copolymer, a linking compound, and nanoparticles; and annealing the solution to produce the composition of the present invention.

BRIEF DESCRIPTION OF THE DRAWINGS

The present invention is described with respect to particular exemplary embodiments thereof and reference is accordingly made to the drawings in which:

FIG. 2 provides a structural formula for PS-b-P4VP (a BCP) and PDP (a bifunctional linking compound).

FIG. 3(a) TEM image of a blend of PS(40)-b-P4VP(5.6)(PDP)$_1$ and ~4 nm CdSe (~2 vol %) NPs where the CdSe NPs are selectively incorporated into the lamellar P4VP(PDP)$_1$ microdomains; (b) and (c) TEM images of a blend of PS(40)-b-P4VP(5.6)(PDP)$_1$ and ~5.4 nm PbS (~7 vol %) NPs. PbS NPs are assembled in the center of the P4VP(PDP)$_1$ lamellae or into layers oriented normal to the lamellar interfaces. Schematic drawings of both NP assemblies are also shown; (d) and (e) TEM images of a blend of PS(40)-b-P4VP(5.6)(PDP)$_2$ and ~4 nm CdSe (2 vol %) NPs. The image analysis on the NP spatial distribution within the BCP lamellae is shown in (f). FWHM is 6.68 nm for 4 nm NPs and the deviation of the NP distribution is only 67% of the CdSe NP size.

FIG. 4(a), (b) TEM and (c) TEM tomography images of a blend of PS(40)-b-P4VP(5.6)(PDP)$_3$ and ~5.4 nm PbS (7 vol %) NPs, showing the PbS NPs arranged in a hexagonal grid. (d) TEM image of the same blend in the region with lower PbS NP loadings. PbS NPs are preferentially sequestered in the corners of the hexagons as schematically shown in (e).

FIG. 5(a) and (b) show the in-situ SAXS profiles of the blend of PS(40)-b-P4VP(5.6)(PDP)$_2$ and ~4 nm CdSe (2 vol %) NPs during the heating and cooling cycles. For (a), the blend was heated from 50 to 160° C. and cooled down to 50° C. at a heating/cooling rate of 10° C./minute. For (b), the blend was cycled between 100° C. and 160° C. The sample was equilibrated for 10 minutes before SAXS images were collected. The scattering profiles were shifted vertically for clarity. Red and blue indicate the heating and cooling process, respectively. SAXS profiles in (a) show that the blend went through two thermoreversible transitions between three assemblies of CdSe NPs, i.e. the CdSe NPs are assembled in the center of P4VP(PDP)$_r$ lamellae from 50-100° C., at the interfaces between the PS-rich and P4VP(PDP)$_r$ lamellae at 110° C. and randomly distributed in the P4VP(PDP)$_r$ lamellae at 150° C. TEM images and schematic drawings of the blend quenched from 50° C., 110° C. and 150° C. are shown in (c), (d) and (e), respectively. For (d), a region with a mixture of NP assembled in the center of lamellae and at the interfaces between lamellae was purposely selected to ensure the sample was imaged edge-on. Upon cycling the temperature between 100 and 160° C., SAXS profiles in (b) show that the peak intensity at the scattering vector range of q=0.02-0.023 Å$^{-1}$ increased during the heating cycle and decreased during the cooling cycle. This trend is exactly opposite of the peak intensity changes at the q range of 0.04-0.045 Å$^{-1}$. This resulted from the CdSe NPs going from being localized within the lamellae, to being at the interface between two microdomains. The in-situ SAXS profiles indicated this thermoresponsive process is reversible.

FIG. 18 TEM image of a ~60 nm thin film of PS(40)-b-P4VP(5.6)(PDP)$_3$/CoFe$_2$O$_4$ NP blend after solvent annealing. Ordered arrays of CoFe$_2$O$_4$ NPs assembled within the BCP lamellae can clearly be seen. (scale bar: 100 nm).

FIG. 28 CdS nanorods in PS(40 kDa)-b-P4VP(5.6kDa) (PDP)$_r$ where r=2. The two images have a a) 3% and b) 6% CdS nanorod loading by volume. The nanorods group together to form rafts and tend to segregate to the center of the P4VP(PDP)r domains, though some do extend away from this central interface.

FIG. 29 SAXS profiles of 3% by volume loading of CdS nanorods in PS(40 kDa)-b-P4VP(5.6 kDa)(PDP)$_r$, where r varies from 1 to 3. A lamellar ordering is evident for r=1, while a cylindrical ordering appears for r=2.

DETAILED DESCRIPTION

I. General

Figure 1:
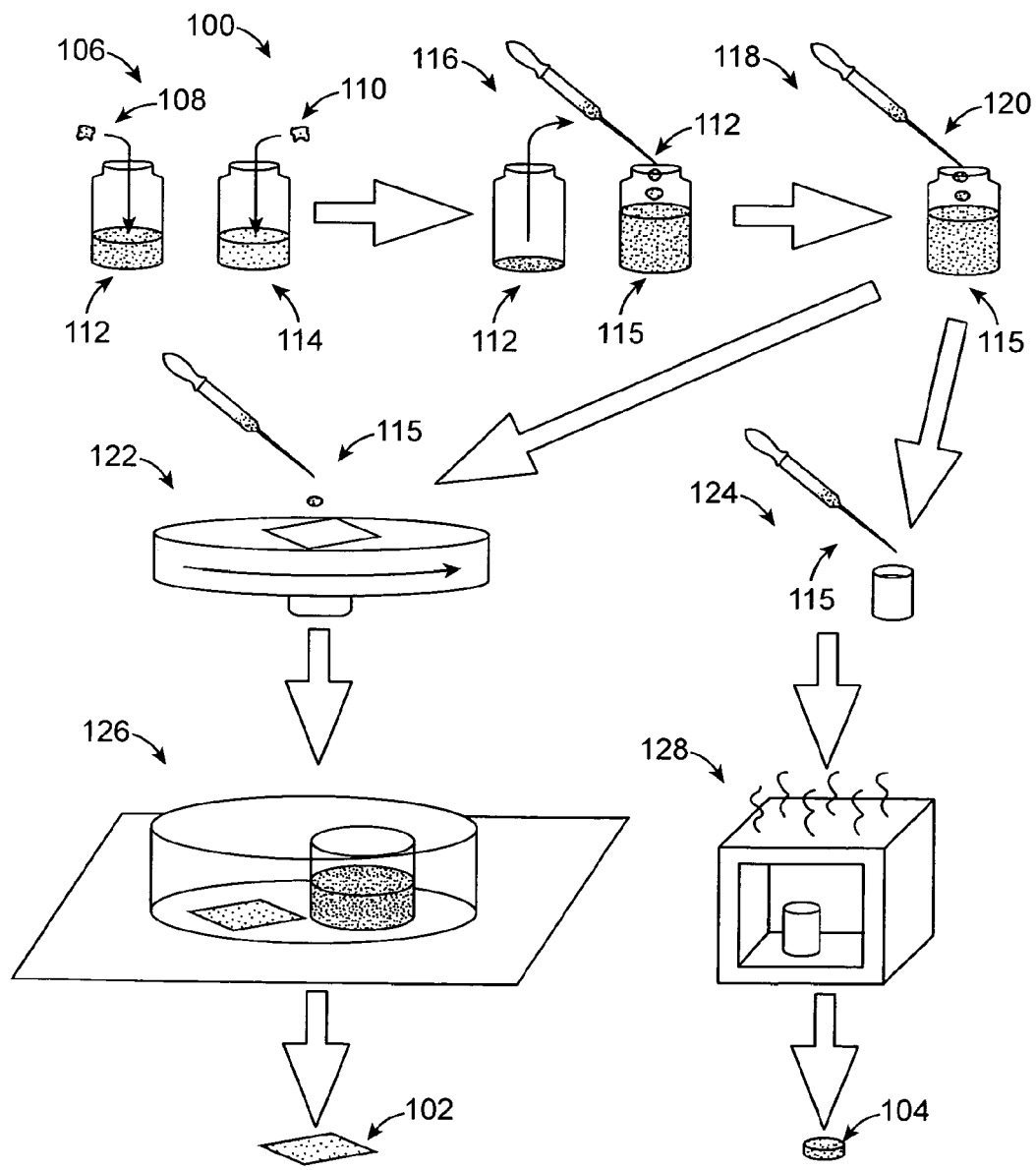
FIG. 1 illustrates an embodiment of a method of making nanocomposites of the present invention as a flowchart.

The present invention is a new paradigm to generate hierarchical assemblies of nanoparticles using mixtures of BCP and bifunctional linking compounds. Control over the spatial distribution of the nanoparticles over multiple length scales has been demonstrated. The use of bifunctional linking compounds has been shown to be a simple, versatile route to tailor the interactions between BCP and nanoparticles, direct interparticle ordering and generate responsive interparticle ordering without need for chemical modification. The approach is versatile, applicable to a wide range of nanoparticles. It is non-disruptive, compatible with existing technological processes and opens new routes for device fabrication based on nanoparticle composite materials.

The present invention describes compositions and methods for the patterning of nanoparticles. The compositions include a block copolymer where one block links to a nanoparticle via a bifunctional linking compound, and a second block that forms a micro-domain. One functional group of the bifunctional linking compound links to one block of the block copolymer via a non-covalent interaction, such as via hydrogen bonding. The other functional group of the bifunctional linking compound links to the ligands on the nanoparticles, for example, by using a hydrophobic moiety such as a long alkyl chain, that then interacts with the hydrophobic alkyl groups of the ligands on the nanoparticles.

II. Definitions

As used herein, the term "nanoparticles" is generic for individual units having a structure in which at least one dimension is on a nanometer scale. In an embodiment, this dimension is on the nanometer scale from 1 nm up to 1 μm. In another embodiment, this dimension is on the nanometer scale from 1 to 100 nm. In yet another embodiment, this dimension is on the nanometer scale from 1 to 50 nm. The term "nanoparticles" includes quantum dots, spherical and pseudo-spherical particles, faceted particles, nanorods, nanowires, tetrapods, anisotropic particles, and other suitable particles. Further, the term "nanoparticles" includes single crystal nanoparticles (i.e. nanocrystals), polycrystalline nanoparticles, and amorphous nanoparticles.

"Block copolymer" refers to a polymer having at least two different monomer groups that are grouped in blocks of one monomer only. The block copolymers are prepared from monomers that include, but are not limited to, acrylates, methacrylates, acrylamides, methacrylamides, styrenes, vinyl-pyridine and vinyl-pyrrolidone. Additional monomers are useful in the block copolymers of the present invention.

"Bifunctional linking compound" refers to a compound having at least two functional groups for linking to at least two other compounds. The functional groups can be the same or different.

"Linker" refers to a chemical moiety that links two separate moieties together. In the present invention, the two moieties are those that non-covalently link to one block of the block copolymer and to the ligands of the nanoparticle. Linkers useful in the present invention can be up to 30 carbon atoms in length, and can include alkyl and heteroalkyl chains, cycloalkyls, heterocycloalkyls, aryls and heteroaryls, and combinations thereof. The types of bonds used to link the two components include, but are not limited to, carbon-carbon bonds, amides, amines, esters, carbamates, ureas, thioethers, thiocarbamates, thiocarbonate and thioureas. One of skill in the art will appreciate that other types of bonds are useful in the present invention.

"Alkyl" refers to a straight or branched, saturated, aliphatic radical having the number of carbon atoms indicated. For example, $C_1$-$C_6$ alkyl includes, but is not limited to, methyl, ethyl, propyl, isopropyl, butyl, isobutyl, sec-butyl, tert-butyl, pentyl, isopentyl, hexyl, etc. Other alkyl groups include, but are not limited to heptyl, octyl, nonyl, decyl, etc. Alkyl can include any number of carbons, such as 1-2, 1-3, 1-4, 1-5, 1-6, 1-7, 1-8, 1-9, 1-10, 2-3, 2-4, 2-5, 2-6, 3-4, 3-5, 3-6, 4-5, 4-6 and 5-6. The alkyl group is typically monovalent, but can be divalent, such as when the alkyl group links two moieties together.

"Haloalkyl" refers to alkyl as defined above where some or all of the hydrogen atoms are substituted with halogen atoms. Halogen (halo) preferably represents chloro or fluoro, but may also be bromo or iodo. For example, haloalkyl includes trifluoromethyl, fluoromethyl, 1,2,3,4,5-pentafluoro-phenyl, etc. The term "perfluoro" defines a compound or radical which has at least two available hydrogens substituted with fluorine. For example, perfluorophenyl refers to 1,2,3,4,5-pentafluorophenyl, perfluoromethane refers to 1,1,1-trifluoromethyl, and perfluoromethoxy refers to 1,1,1-trifluoromethoxy.

III. Hierarchical Assemblies

The present invention provides hierarchical assemblies of a block copolymer, a bifunctional linking compound and a nanoparticle. The block copolymers and bifunctional linking compound form one micro-domain and the nanoparticles another micro-domain.

Bifunctional linking compounds can be attached to one block of a block copolymer using noncovalent interactions to form a BCP-based supramolecule that produces many noteworthy structures. The BCPs self assemble on the tens of nanometers length scale, while the bifunctional linking compounds assemble on a smaller, few nanometers length scale, yielding numerous types of hierarchical structures. Since the bifunctional linking compounds are not covalently linked to the polymer, they can be used to tailor the interactions between the supramolecules and ligands attached to nanoparticle surfaces or chosen to introduce various functionalities. The unique architecture of the supramolecules—one block forms a random coil while the other forms a tomblike structure with the bifunctional linking compounds—and the organization of the bifunctional linking compounds within the microdomains exert an additional driving force to arrange the nanoparticles within the microdomains in an orderly fashion, without requiring specially designed nanoparticles or polymers. Therefore, BCP-based supramolecules afford a simple, yet robust and versatile, approach to direct nanoparticle assembly.

An additional benefit in using these supramolecules is that, since the bifunctional linking compounds are not covalently bound to the polymer, external stimuli can be used to redistribute them. For example, heat can be applied to the supramolecule to allow the bifunctional linking compounds to dissolve in both blocks of the BCP, or a solvent can be used to selectively remove a fraction of only the bifunctional linking compounds. Such rearrangements change the volume fraction of the microdomains, and can cause morphological transitions. Inter-particle ordering and particle spatial distributions can thus be controlled, resulting in a responsive functional nanocomposite. When considered along with recent developments in the control of macroscopic orientations and long-range order of the microdomains, BCP-based supramolecules present one of the simplest and most controllable means to direct the self-assembly of ex-situ synthesized nanoscale materials.

In some embodiments, the present invention provides a composition having a plurality of nanoparticles each having a ligand linked to a surface of the nanoparticle; a plurality of block copolymers each comprising a first block and a second block; and a bifunctional linking compound that non-covalently links to one block of one of the block copolymers and to the ligand on the surface of the nanoparticle, wherein the nanoparticles are arranged in an array to form a first microdomain, and the block copolymers form a second microdomain.

Nanoparticles useful in the compositions of the present invention include any suitable nanoparticle. For example, the nanoparticles can be a metal, a semiconductor, an inorganic material, a ceramic, a magnetic material, a metal chalcogenide, a metal oxide, or a combination thereof. In some embodiments, the nanoparticles can be a metal, a semiconductor, a magnetic material, a metal chalcogenide, a metal oxide, or a combination thereof Semiconductors useful in the nanoparticles of the present invention include any material whose electrical conductivity is in between that of a conductor and that of an insulator. Semiconductors useful in the present invention include, but are not limited to a Group I-VII semiconductor, a Group II-VI semiconductor, a Group II-V semiconductor, a Group III-V semiconductor, a Group IV semiconductor, a Group IV-VI semiconductor, a Group V-VI semiconductor, or a metal.

In some embodiments, Group I-VII semiconductors useful in the present invention include any semiconductor comprising both a Group I element (Cu, Ag, Au) and a Group VII element (F, Cl, Br, I, At). Group I-VII semiconductors include, but are not limited to, Cuprous chloride (CuCl). One of skill in the art will appreciate that other Group I-VII semiconductors are useful in the present invention.

In other embodiments, Group II-V semiconductors useful in the present invention include any semiconductor comprising both a Group II element (Zn, Cd, Hg) and a Group V element (N, P, As, Sb, Bi). Group II-V semiconductors include, but are not limited to, Cadmium phosphide ($Cd_3P_2$), Cadmium arsenide ($Cd_3As_2$), Cadmium antimonide ($Cd_3Sb_2$), Zinc phosphide ($Zn_3P_2$), Zinc arsenide ($Zn_3As_2$) and Zinc antimonide ($Zn_3Sb_2$). One of skill in the art will appreciate that other Group II-V semiconductors are useful in the present invention.

In another embodiment, Group II-VI semiconductors useful in the present invention include any semiconductor comprising both a Group II element (Zn, Cd, Hg) and a Group VI element (O, S, Se, Te, Po). Group II-VI semiconductors include, but are not limited to, Cadmium selenide (CdSe), Cadmium sulfide (CdS), Cadmium telluride (CdTe), Zinc oxide (ZnO), Zinc selenide (ZnSe), Zinc sulfide (ZnS), Zinc telluride (ZnTe), Cadmium zinc telluride (CdZnTe, CZT), Mercury cadmium telluride (HgCdTe), Mercury zinc telluride (HgZnTe) and Mercury zinc selenide (HgZnSe). One of skill in the art will appreciate that other Group II-VI semiconductors are useful in the present invention.

In other embodiments, Group III-V semiconductors useful in the present invention include any semiconductor comprising both a Group III element (B, Al, Ga, In, Tl) and a Group V element (N, P, As, Sb, Bi). Group III-V semiconductors include, but are not limited to, Aluminum antimonide (AlSb), Aluminum arsenide (AlAs), Aluminum nitride (AlN), Aluminum phosphide (AlP), Boron nitride (BN), Boron phosphide (BP), Boron arsenide (BAs), Gallium antimonide (GaSb), Gallium arsenide (GaAs), Gallium nitride (GaN), Gallium phosphide (GaP), Indium antimonide (InSb), Indium arsenide (InAs), Indium nitride (InN), Indium phosphide (InP), Aluminum gallium arsenide (AlGaAs, $Al_xGa_{1-x}$As), Indium gallium arsenide (InGaAs, $In_xGa_{1-x}$As), Aluminum indium arsenide (AlInAs), Aluminum indium antimonide (AlInSb), Gallium arsenide nitride (GaAsN), Gallium arsenide phosphide (GaAsP), Aluminum gallium nitride (AlGaN), Aluminum gallium phosphide (AlGaP), Indium gallium nitride (InGaN), Indium arsenide antimonide (InAsSb), Indium gallium antimonide (InGaSb), Aluminum gallium indium phosphide (AlGaInP, also InAlGaP, InGaAlP, AlInGaP), Aluminum gallium arsenide phosphide (AlGaAsP), Indium gallium arsenide phosphide (InGaAsP), Aluminum indium arsenide phosphide (AlInAsP), Aluminum gallium arsenide nitride (AlGaAsN), Indium gallium arsenide nitride (InGaAsN), Indium aluminum arsenide nitride (InAlAsN) and Gallium indium nitride arsenide antimonide (GaInNAsSb). One of skill in the art will appreciate that other Group III-V semiconductors are useful in the present invention.

In some embodiments, Group IV semiconductors useful in the present invention are those semiconductors comprising only Group IV elements (C, Si and Ge) and can be elemental or compound semiconductors. Group IV semiconductors include, but are not limited to, diamond (C), silicon (Si), germanium (Ge), silicon carbide (SiC) and silicon germanide (SiGe). One of skill in the art will appreciate that other Group IV semiconductors are useful in the present invention.

In other embodiments, Group IV-VI semiconductor useful in the present invention include any semiconductor comprising both a Group IV element (C, Si, Ge, Sn, Pb) and a Group VI element (O, S, Se, Te, Po), as well as other elements. Group IV-VI semiconductors include, but are not limited to, Lead selenide (PbSe), Lead sulfide (PbS), Lead telluride (PbTe), Tin sulfide (SnS), Tin telluride (SnTe), lead tin telluride (PbSnTe), Thallium tin telluride ($Tl_2SnTe_5$) and Thallium germanium telluride ($Tl_2GeTe_5$). One of skill in the art will appreciate that other Group IV-VI semiconductors are useful in the present.

In some embodiments, Group V-VI semiconductors useful in the present invention include any semiconductor comprising both a Group V element (N, P, As, Sb, Bi) and a Group VI element (O, S, Se, Te, Po). Group V-VI semiconductors include, but are not limited to, Bismuth telluride ($Bi_2Te_3$). One of skill in the art will appreciate that other Group V-VI semiconductors are useful in the present invention.

Additional semiconductors useful in the present invention include, but are not limited to, layered semiconductors. Layered semiconductors include, but are not limited to, Lead(II) iodide ($PbI_2$), Molybdenum disulfide ($MoS_2$), Gallium Selenide (GaSe), Tin sulfide (SnS) and Bismuth Sulfide ($Bi_2S_3$). Other semiconductors useful in the present invention include, but are not limited to, Copper indium gallium selenide (CIGS), Platinum silicide (PtSi), Bismuth(III) iodide ($BiI_3$), Mercury(II) iodide ($HgI_2$), Thallium(I) bromide (TlBr), Titanium dioxide: anatase ($TiO_2$), Copper(I) oxide ($Cu_2O$), Copper(II) oxide (CuO), Uranium dioxide ($UO_2$) and Uranium trioxide ($UO_3$). One of skill in the art will appreciate that other semiconductors are useful in the present invention.

In some embodiments, the particles can comprise a metal. Metals useful in the present invention include, but are not limited to, the alkali metals, alkali earth metals, transition metals, post-transition metals and the lanthanides. Alkali metals include Li, Na, K, Rb and Cs. Alkaline earth metals include Be, Mg, Ca, Sr and Ba. Transition metals include Sc, Ti, V, Cr, Mn, Fe, Co, Ni, Cu, Zn, Y, Zr, Nb, Mo, Tc, Ru, Rh, Pd, Ag, Cd, La, Hf, Ta, W, Re, Os, Ir, Pt, Au, Hg and Ac. Post-transition metals include Al, Ga, In, Tl, Ge, Sn, Pb, Sb, Bi, and Po. Lanthanides include La, Ce, Pr, Nd, Pm, Sm, Eu, Gd, Tb, Dy, Ho, Er, Tm, Yb and Lu. One of skill in the art will appreciate that the metals described above can each adopt several different oxidation states, all of which are useful in the present invention. In some instances, the most stable oxidation state is foi ned, but other oxidation states are useful in the present invention.

In other embodiments, the nanoparticles are CdS, CdSe, PbS, Au, or $CoFe_2O_4$.

The nanoparticles of the present can adopt any suitable shape or orientation. In some embodiments, the nanoparticles are quantum dots, spherical and pseudo-spherical particles, faceted particles, nanorods, nanowires, tetrapods, anisotropic particles, or a combination thereof.

The nanoparticle ligands can be any suitable ligand. In some embodiments, the nanoparticle ligand is any tri-alkyl phosphate, phosphonate, phosphite, phosphine or phosphine oxide, or carboxylic acid. In other embodiment, the ligand covers the surface of the nanoparticles. One of skill in the art will appreciate that other ligands are useful in the present invention.

The block copolymers of the present invention can be any suitable block copolymer that forms a micro-domain and that binds to the bifunctional linking compound non-covalently. One or both blocks of the block copolymer can be capable of non-covalently linking to the bifunctional linking compound. In some embodiments, only one block of the block copolymer is capable of non-covalently linking to the bifunctional linking compound.

In some embodiments, the non-covalent binding is via hydrogen bonding. For example, one block of the block copolymer can include a hydrogen donor or a hydrogen acceptor. In some other embodiments, the second block of the block copolymer includes a hydrogen-bond acceptor. Hydrogen-bond acceptors include, but are not limited to, carbonyls, amines, nitrogen-containing rings such as pyridine, oxygen containing rings such as furan, etc. Alternatively, one block of the block copolymer can include a hydrogen bond donor, including, but not limited to, OH, $NH_2$ and SH. Other hydrogen-bond acceptors and donors are known to one of skill in the art.

In other embodiments, the other block of the block copolymer forms a micro-domain. Polymers capable of forming a micro-domain are known, and include, but are not limited to, polystyrene. In other embodiments, the block copolymer includes polystyrene-block poly-4-vinylpyridine (PS-b-P4VP).

The bifunctional linking compounds useful in the composition include any bifunctional compound able to link to the block copolymer and to the nanoparticle. As for the block copolymer, when the non-covalent binding is via hydrogen bonding, the bifunctional linking compound can include either a hydrogen donor or a hydrogen acceptor.

In some embodiments, the bifunctional linking compound includes a hydrogen donor. In other embodiments, the bifunctional linking compound has the formula:

A-L-B wherein A is a hydrogen-bond donor of OH, $NH_2$ or SH; L is a linker, a bond, —C(O)—, —C(O)O—, —C(O)NH—, —P(O)(OR)O—, —P(O)(OR)—, or —S(O)$_2$—; and B is $C_{6-20}$ alkyl or $C_{6-20}$ haloalkyl. Alternatively, A can be a hydrogen-bond acceptor, such as described above for the block copolymer.

In some embodiments, the bifunctional linking compound includes a hydrogen-bond donor such as OH, $NH_2$ or SH. In other embodiments, the bifunctional linking compound includes $C_{6-20}$ alkyl or $C_{6-20}$ haloalkyl. In other embodiments, the bifunctional linking compound is 3-n-pentadecylphenol (PDP), 4-(4'-Octylphenyl)azophenol (OPAP), 5'''-(3,7-dimethyloctyl)-5-(3-(3-hydroxyphenyepropyl)-[2,2';5',2'';5''', 2'''] quaterthiophene (4T), 4-(3,3,4,4,5,5,6,6,7,7,8,8,9,9,10, 10,10-heptadecafluorodecylthio)phenol (FDP) or (8S,9S, 10R,13R,14S,17R)-10,13-dimethyl-17-((R)-6-methylheptan-2-yl)-2,3,4,7,8,9,10,11,12,13,14,15,16,17-tetradecahydro-1H-cyclopenta[a]phenanthren-3-yl (3-hydroxyphenyl)succinate (a cholesterol hemisuccinate also known as ChHP). In some other embodiments, the bifunctional linking compound is 3-n-pentadecylphenol (PDP) or 4-(4'-Octylphenyl)azophenol (OPAP). In still other embodiments, the bifunctional linking compound is octadecylphosphonic acid or oleic acid.

In some embodiments, the array includes a one dimensional array. In other embodiments, the nanoparticles are arranged in a closed packed structure in the one dimensional array. In some other embodiments, the array includes a two dimensional array. In still other embodiments, the array includes a three dimensional array. In yet other embodiments, the second micro-domain forms a matrix that separates a plurality of first micro-domains from each other.

The present invention also provides methods of making a nanocomposite of the above compositions. The method involves mixing the block copolymer, the bifunctional linking compound and nanoparticles, and annealing the solution. In some embodiments, the present invention provides a method of making a nanocomposite involving forming a solution of a block copolymer, a bifunctional linking compound, and a plurality of nanoparticles; and annealing the solution to produce the composition of the present invention.

An embodiment of a method of making nanocomposites of the present invention is illustrated in FIG. 1 as a flowchart. The method 100 produces a thin-film nanocomposite 102 or, alternatively, a bulk-solid nanocomposite 104. In a first step 106, a BCP 108 and a bifunctional linking compound 110 are dissolved in solvents, 112 and 114, respectively, to produce a polymer solution 112 and a bifunctional linking compound solution 114. In an embodiment, a single solvent is used for the polymer and bifunctional linking compound solutions, 112 and 114. In another embodiment, different solvents are used for the polymer and bifunctional linking compound solutions, 112 and 114. The polymer solution 112 is added to the bifunctional linking compound solution 114 in a second step 116 to produce a solution 115 that includes the BCP 108 and the bifunctional linking compound 110. In an embodiment, the solution 115 is stirred so that bifunctional linking compounds 110 attach to a chosen block of the BCP 108. In a third step 118, nanoparticles 120 that are dissolve in a solvent are added to the solution 115. The nanoparticles may comprise a metal, a semiconductor, a magnetic material, a metal chalcogenide, a metal oxide, or some other suitable material.

In an embodiment, the solution 115 is stirred so that the bifunctional linking compounds interact with the ligands, which are on surfaces of the nanoparticles 120. The solvent (or solvents) that combine the BCP 108, the bifunctional linking compound 110, and the nanoparticles 120 is chosen on a basis of an ability to dissolve the BCP 108, the bifunctional linking compound 110, and the nanoparticles 120. The bifunctional linking compound 110 may be selected so that it has favorable interactions with, but does not bond covalently to, a single block of the BCP 108 and passivating ligands of the nanoparticles 120. The solution 115 is then spin cast in a fourth step 122 or placed in a Teflon beaker in an alternative fourth step 124 and annealed in a fifth step 126 or an alternative fifth step 128 to produce the thin-film nanocomposite 102 or the bulk-solid nanocomposite 104, respectively.

For bulk solid, the samples are thermally annealed under vacuum at a high enough temperature to impart polymer mobility. For thin films, the samples are solvent annealed in the presence of a high partial pressure of a solvent. These procedures result in a thin film or bulk solid with a hierarchically ordered structure and, for example, alternating conductive (or semiconductive) nanoparticle-rich and nonconductive nanoparticle-poor regions.

As described in the examples below, consider polystyrene-block poly-4-vinylpyridine (PS-b-P4VP) with molecular weights of 40,000 and 5,600, respectively, as the BCP; 3-pentadecylphenol (PDP) as the bifunctional linking compound (FIG. 2); and spherical or pseudo-spherical CdSe nanoparticles about 4 nm in diameter capped with octadecylphosphonic acid (ODPA) ligands as the nanoparticles.

The PS-b-P4VP consists of two random-coil blocks and forms spherical microdomains of P4VP surrounded by a matrix of PS. Without being bound to a particular theory, when the PDP hydrogen bonds to the pyridine rings, the P4VP block is stretched out to form a rigid comb-block. This structure occupies significantly more volume, and so the supramolecule forms lamellar, rather than spherical, microdomains. By binding to the pyridine rings, the PDP forms a periodic lamellar structure as well, resulting in a lamellae-within-lamellae hierarchical morphology. Chloroform dissolves PS and P4VP nearly equally well, and also dissolves PDP, and so was chosen as the solvent.

A range of nanoparticles with different sizes and shapes have been studied. The examples below present results with cadmium selenide (CdSe, ~4 nm in diameter) and lead sulfide (PbS, ~5.4 nm in diameter) nanoparticles, among others. Similar results were found with a large variety of nanoparticles with different sizes and shapes, including $CoFe_2O_4$ (6 nm), Au (4-30 nm) and CdSe (2 nm) nanoparticles and CdSe nanorods (3×20 nm and 6×17 nm). The CdSe and PbS nanoparticles were capped with octadecylphosphonic acid and oleic acid ligands, respectively. Both ligands have a long alkane tail that has favorable interactions with the PDP alkane tail, and makes it possible to suspend the nanoparticles in chloroform. The interactions with PDP force the nanoparticles to the center of the P4VP(PDP) domains where, given enough nanoparticles, they form a straight line of nanoparticles.

To produce the nanocomposite, a solution of PS-b-P4VP in chloroform was added dropwise to integer multiples of a stoichiometric amount of PDP also in chloroform and stirred overnight. The nanoparticles, also suspended in chloroform, were then added at a concentration of about 20% by weight and the solution again stirred overnight. Thin films were created by spin casting the solution and annealing in chloroform vapor for at least 24 hours, and bulk samples were created by allowing the solution to dry in a Teflon beaker and annealing the result overnight.

Characterization of the blends of nanoparticle and block copolymer-based supramolecules was carried out using TEM (transmission electron microscopy) and SAXS (small angle x-ray scattering). Both results showed that the structure of the nanocomposite remains similar to that of the pure supramolecule, but the nanoparticles are forced to the centers of the P4VP(PDP) domains. This occurs because the favorable interactions between the alkane tails on the ODPA and the PDP provide a strong enthalpic driving force to incorporate the CdSe nanoparticles within the P4VP(PDP) domains, and the rigid comb block structure also makes it entropically favorable to concentrate the nanoparticles along the interface between two sets of comb blocks, which is in the center of the microdomain. So, the nanoparticles arrange in a highly linear fashion along the center of the P4VP(PDP) domains without any detectable aggregation.

Since the bifunctional linking compounds are not covalently attached to the BCP, they can be custom-designed to be compatible with the nanoparticle ligands. The distribution of bifunctional linking compounds among different BCP blocks also provides effective means to fine tune the interactions between each block with the nanoparticle. Furthermore, the bonding of the bifunctional linking compounds to the BCP can be strengthened, weakened or even broken in response to an external stimulus, which, in turn, will lead to a spatial redistribution of the nanoparticles and, possibly, a phase transition in the BCP.

PDP, the bifunctional linking compound, is not covalently bonded to the P4VP block. At temperatures above 125° C., the PDP is soluble in both PS and P4VP. As the free PDP moves from the P4VP(PDP) to the PS microdomain, the relative volume fraction of the microdomains changes, giving rise to a transition in the morphology. In blends of nanoparticles with PS-b-P4VP(PDP)$_r$, this morphological transition will also change the assembly of the nanoparticles. This was confirmed via the SAXS and TEM image of a blend of PS(40)-b-P4VP(5,6)(PDP)$_2$ with 4 nm CdSe nanoparticles after annealing at 150° C. and slow cooling to room temperature over 12 hrs. The re-distribution of the PDP transformed the spatial distribution of CdSe from lamellae to hexagonally packed cylinders.

Localizing the nanoparticles at the interfaces between the microdomains requires a balance between interfacial energies and entropy that tends to randomize the spatial distribution of the nanoparticles. Previously, this was achieved by growing random block copolymers from the nanoparticle surfaces to reduce interfacial interactions between the blocks or using nanoparticles with ligands identical in chemical composition to each block. The latter approach relied on a redistribution of the ligands to form essentially Janus particles (particle that has at least two physically or chemically differing surfaces) that acted like surfactants that localized to the interface. Alternatively, very small nanoparticles can locate at the interface to reduce the amount that each block of the copolymer must stretch at the interface to minimize contacts with the second block. By anchoring the bifunctional linking compound to one block, the BCP can have a coil-comb configuration. This results in a significant cross-sectional area mismatch at the interface between the coil and comb blocks. Nanoparticles located at the interface between these blocks will significantly reduce the entropic penalty arising from this mismatch. The interactions between PS and P4VP are strongly nonfavorable, the contacts between PS and P4VP will be minimized. In the presence of PDP, these repulsive interactions are much less. This can be effectively accomplished by placing the nanoparticles at the interface between the microdomains. The distribution of the PDP (bifunctional linking compounds) in each microdomain also modifies the interactions between each block with the nanoparticles. Preferential interactions between the PDP and the ligands on the nanoparticles drive the incorporation of the nanoparticles into the P4VP(PDP) microdomains. As the solubility of PDP in PS increases, the interactions between the PS and the nanoparticle ligands, the P4VP with the nanoparticles ligands and the PS and P4VP may vary and will control the location of the nanoparticles.

As the temperature increases, the solubility of PDP can change and the chain architecture of PS-b-P4VP(PDP), can also change. Consequently, the spatial arrangements of nanoparticles will respond to these changes. In-situ SAXS studies were carried out with a solvent-cast blend of PS(40)-b-P4VP (5.6)(PDP)$_2$ with the 4 nm CdSe. The in-situ SAXS studies demonstrate that the location of the CdSe nanoparticles was changed from the interface to the center of the microdomains simply by controlling the temperature. This process is reversible and provides a means of controlling the local environment of the nanoparticles, the areal density of the nanoparticles and, therefore, the interparticle separation distance and ordering.

The annealing can be performed by any suitable means known to one of skill in the art. In some embodiments, the annealing involves a solvent anneal. In other embodiments, the annealing involves a thermal anneal.

Precise control of the spatial organization of nanoscopic building blocks over multiple length scales is a bottleneck in the "bottom-up" generation of technologically important materials. The present invention provides a simple, yet versatile approach to produce stimuli-responsive hierarchical assemblies of readily available nanoparticles by combining bifunctional linking compounds and block copolymers (BCP). Organization of nanoparticles into one, two and three-dimensional arrays with controlled inter-particle separation and ordering is achieved without chemical modification of either the nanoparticles or BCPs. Nanocomposites responsive to heat and light are demonstrated, where the spatial distribution of the nanoparticles can be varied by exposure to heat or light or changing the local environment. The approach described is applicable to a wide range of NPs and compatible with existing fabrication processes, thereby enabling a non-disruptive approach for the generation of functional devices.

Bifunctional linking compounds, in comparison to BCPs, are more easily synthesized so as to design in specific functionality or intermolecular interactions. By attaching bifunctional linking compounds that favorably interact with the NP ligands to the polymer side-chains in a non-covalent manner, for example by hydrogen bonding or electrostatic interactions, NP-polymer interactions can be tailored. This decouples the NP surface chemistry and the chemical constitution of the BCP, eliminates the need to modify either the NP ligands or the polymer, and thus significantly expands the repertoire of NPs that can be solubilized in polymers. The noncovalent linkage between the bifunctional linking compounds and BCP can be strengthened or broken by external stimuli, resulting in changes of the chain configuration, a redistribution of the bifunctional linking compounds, and, therefore, a change in the spatial distribution of the NPs. Functional, stimuli-responsive bifunctional linking compounds can be readily substituted to fine-tune or incorporate specific properties. Therefore, the local environment and spatial arrangement of the NPs can be tailored, opening further routes to manipulate the properties of these nanocomposites. The attachment of bifunctional linking compounds to one block of the BCP changes the architecture of the BCP from a coil-coil to a coil-comb BCP and, also, the configuration of the BCP backbone chain, providing a unique handle to direct NP assembly at a single polymer chain level. The change in the entropy of the BCP chain arising from the incorporation of the NPs depends on the polymer chain architecture and its stiffness. These provide further controls for tailoring the thermodynamics of the assembly process. In addition, the bifunctional linking compounds constituting the teeth of the comb-block can order on the molecular level within the BCP microdomains, resulting in hierarchical assemblies that can further guide the spatial distribution of the NPs with a precision akin to that seen when using DNA, but over large lateral areas.

A variety of bifunctional linking compounds, such as 3-n-pentadecylphenol (PDP) and 4-(4'-Octylphenyl)azophenol (OPAP), were used to hydrogen-bond to a BCP. Moreover, polystyrene-block-poly(4-vinyl pyridine) (PS-b-P4VP) was used to precisely direct NP assemblies over multiple length scales. The examples below demonstrate that thermo- and light-responsive, hierarchical assemblies of a wide range of NPs, independent of size and shape, can be produced without chemically modifying the NPs or BCPs. The approach described can be extended to bifunctional linking compounds with built-in functionalities and stimuli-responsiveness. This directed co-assembly of bifunctional linking compounds, BCPs and NPs overcomes many impediments in "bottom-up" fabrication and opens new routes to precisely control the spatial distribution of nanoscale materials over multiple length scales and to generate stimuli-responsive nanocomposites.

A PS-b-P4VP BCP with PS and P4VP with block molecular weights of 40 and 5.6 KDa, was used in some embodiments. The phenol group of PDP can hydrogen bond to the 4VP unit of the P4VP and form a PS-b-P4VP(PDP)$_r$ (the subscript r denotes the ratio of PDP to 4VP unit) supramolecule. PS(40)-b-P4VP(5.6)(PDP)$_1$ can form a lamellae-within-lamellae hierarchical assembly. PDP can be used since the alkyl tail is similar to the alkane ligands used to stabilize many NPs. Other bifunctional linking compounds that can interact with the BCP and the NP ligands can also be used. In a blend of PS(40)-b-P4VP(5.6)(PDP)$_1$, r=1, with 4 nm CdSe NPs (~2 vol %) capped with octadecylphosphonate ligands, the transmission electron microscopy (TEM) and small angle x-ray scattering (SAXS) (FIG. 11) studies showed that without surface modification, the CdSe NPs were exclusively incorporated into the P4VP(PDP)$_r$ lamellar microdomains.

The comb-block, P4VP(PDP)$_r$, assemblies within the BCP microdomains and can further direct the NP assembly. Upon increasing the volume fraction of NPs to 7% (5.4 nm PbS NPs capped with oleate ligands are used in this case), two different types of ordering are observed (FIGS. 3b and c). In addition to the sequestration of the PbS NPs in the center of the P4VP (PDP)$_1$ microdomains, the PbS NPs also are seen to intercalate between the P4VP(PDP)$_1$ comb-blocks within the BCP lamellae.

Figure 13A:
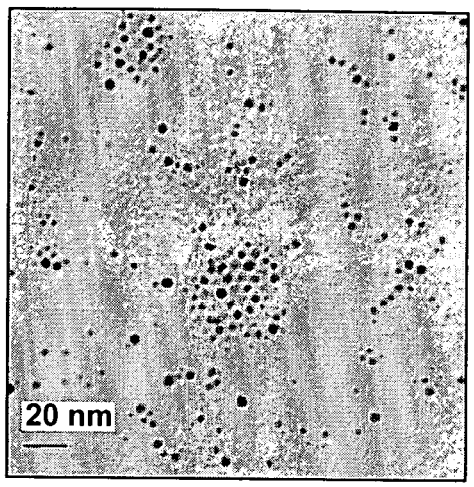
FIG. 13 TEM image of a PS-b-P4VP(PDP)$_1$/Au NP blend (a) and the Au NPs (b); Au NPs of different sizes assembled in the middle of P4VP(PDP), can be clearly seen.
Figure 13B:
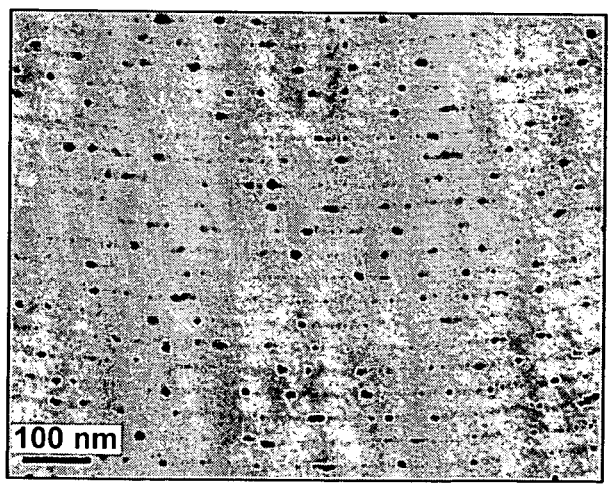

Directing the NP localization upon blending with BCP requires specific NP-polymer interactions. This was previously achieved by either NP ligand exchange or modification. However, changing the NP ligand shell can alter the properties of the NPs and for many NPs, be synthetically challenging. To capitalize on the inherent characteristics of the NPs, it can be useful to modify the NP surfaces in a non-perturbing manner and to use the native ligands on the NPs remaining from their synthesis. In the present invention, NP ligand modification is unnecessary since the favorable interactions between the PDP and the NP's native alkyl ligands selectively incorporate the NPs into the P4VP(PDP)$_r$ microdomain, independent of the NP shape and size. Similar results were found with a large variety of NPs with different sizes and shapes, including CoFe$_2$O$_4$ dots (6 nm), Au dots (3-20 nm), PbS dots (2 nm), CdSe dots (2 nm) and CdSe nanorods (3×20 nm and 6×17 nm) (see FIG. 13). The entropy associated with the polymer chain deformation upon incorporating the NPs also plays an important role in the NP spatial distribution. In the present invention, no size dependence on the spatial distribution of the NPs in the NP/supramolecule blends was observed. The TEM image in FIG. 13 shows that Au NPs of different sizes—where ratio of the nanoparticle size (d) and the equilibrium period of the supramolecule/NP blend (L), d/L, ranged from 0.075 to 0.4—assembled at the center of the P4VP(PDP)$_1$ lamellae.

Dispersing NPs within the BCP microdomain alters the BCP chain configuration, where the entropic penalty depends on the polymer chain stiffness, architecture and NP size. By attaching PDP to 4VP, P4VP changes from a random coil to a P4VP(PDP)$_r$ comb that orders within the P4VP(PDP)$_r$ microdomain. Increasing the stoichiometry of PDP to 4VP stiffens the P4VP(PDP)$_r$ block. Free PDP can also be intercalated between the hydrogen-bonded PDP, further increasing the stiffness of the comb-block. This increases the entropic penalty arising from the polymer chain deformation upon the incorporation of the NPs. FIG. 3d and e show TEM images of a blend of PS(40)-b-P4VP(5.6)(PDP)$_2$ and 4 nm CdSe NPs (~2 vol %). The CdSe NPs formed a single layer, only one particle diameter in thickness, in the center of the P4VP (PDP)$_2$ lamellae. TEM images were analyzed to characterize the average NP position within the supramolecular assemblies (FIG. 16). By fitting the average NP location within the lamellae to a Gaussian function, the full-width at half maximum (FWHM) is found to be 6.68 nm for the CdSe NPs, 4 nm in diameter as shown in FIG. 3f. Upon increasing the NP loading (7 vol %, 5.4 nm PbS NPs used in this case) the spatial distribution of the NPs greatly narrows, relative to the size of the NP. 3-D TEM tomography (FIG. 17) shows a stack of PbS NP sheets ~6.6 nm in thickness with a ~36 nm periodicity. Consequently, there is a strong localization of the NPs to the center of the microdomains. The deviation in the NP spatial distribution is only a fraction of the NP size, as opposed to a few times of the size of the NPs, as reported previously using BCPs alone. The precision in locating the NPs spatially is comparable to that seen in the DNA approach, representing a significant improvement over existing methods. More importantly, by combining bifunctional linking compounds and BCPs, the NP assemblies can be readily solution processed over arbitrarily large areas. The TEM image of a ~60 nm thin film of PS(40)-b-P4VP(5.6)(PDP)$_3$ and CoFe$_2$O$_4$ (FIG. 18) shows that CoFe$_2$O$_4$NPs assemble into chains of NPs with the BCP lamellar morphology oriented normal to the surface.

Figure 19:
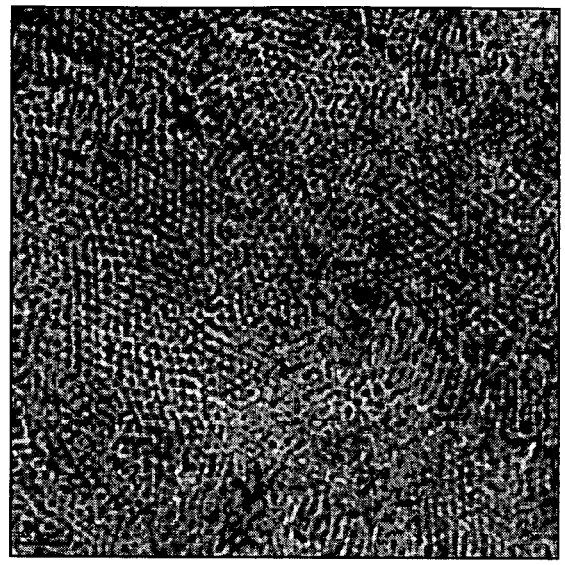
FIG. 19 TEM image of PS(40K)-b-P4VP(5.6K)(PDP)$_3$ (scale bar: 200 nm).
Figure 21A:
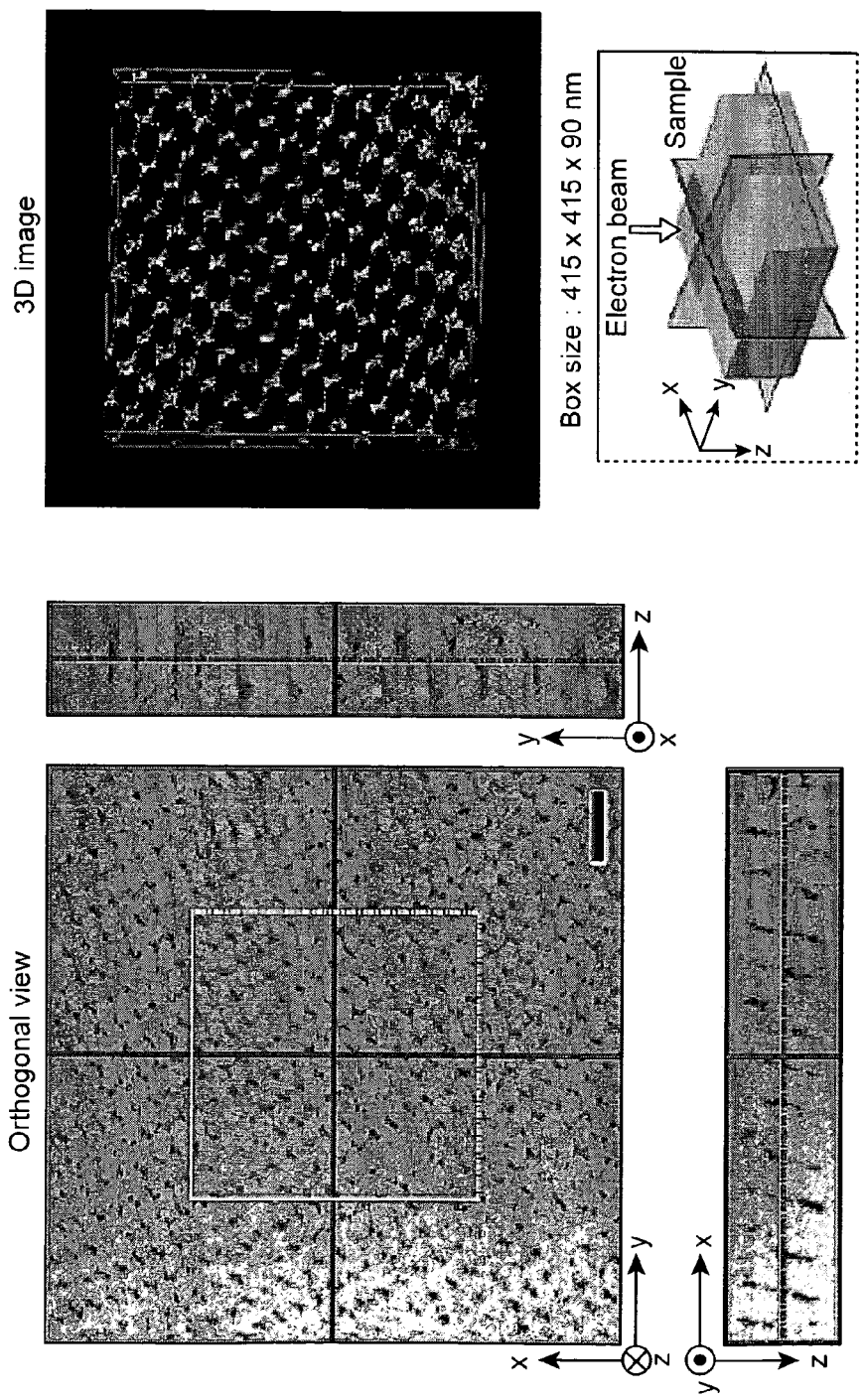
FIG. 21(a) TEM Tomography and orthogonal views of a PS-b-P4VP(PDP)$_3$ and 5.4 nm PbS NP composite. The beam direction is along the Z axis. (scale bar: 100 nm).
Figure 21B:
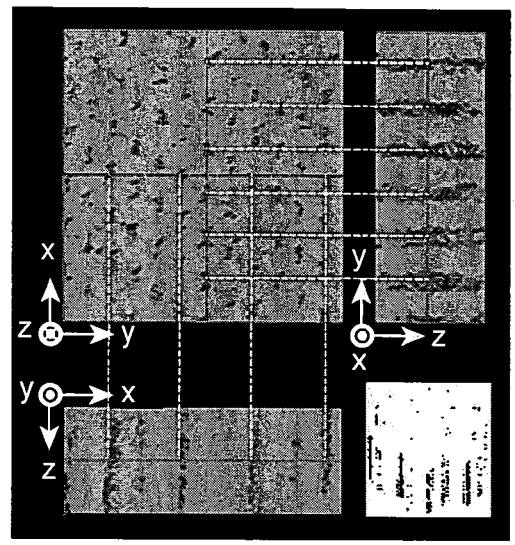
FIG. 21(b) TEM Tomography and orthogonal views of a PS-b-P4VP (PDP)$_3$ and ~5.4 nm PbS NP composite. The beam direction is along the Z axis. This area is selected for lower nanoparticle loading, showing nanoparticle sequestration at the vertices. (scale bar: 100 nm).

Similar results were found for NPs blended with supramolecules that formed cylindrical microdomains. At a PDP to P4VP ratio of 3, the volume fraction of P4VP(PDP)$_r$ increases and PS(40)-b-P4VP(5.6)(PDP)$_3$ forms a morphology with hexagonally packed PS-rich cylinders embedded in a P4VP(PDP)$_3$ matrix (FIG. 19). FIG. 4a and b show TEM images of a blend of PS(40)-b-P4VP(5.6)(PDP)$_3$ with 5.4 nm PbS NPs (7 vol %). The TEM tomography image is shown in FIG. 4c and FIG. 21(a). PbS NPs are sequestered between the P4VP(PDP)$_r$ blocks associated with each cylindrical PS microdomain and form a hexagonal grid of NPs within the P4VP(PDP)$_3$ matrix. When the NP fraction is reduced, the PbS NPs are preferentially sequestered to the interstitial areas of the hexagonal array forming columns of NPs as shown in FIG. 4(d), FIG. 21(b) and (c), and the schematic drawing in 2e. For PS(40)-b-P4VP(5.6)(PDP)$_3$ where the comb comprises the matrix, the backbone of P4VP is already stretched to form the P4VP(PDP)$_r$ comb-block. Stretching the chains further to fill the interstitial regions, which is mandated by the incompressibility of the polymer, is energetically very costly. Filling the interstitial regions with the NPs reduces the required stretching and, as such, is energetically favorable. Thus, by simply adding the bifunctional linking compounds, the interactions between the BCP and NPs and the polymer chain configuration, stiffness and packing can be readily tailored to manipulate the enthalpic and entropic contributions to the NP assembly process. Consequently, ordered arrays of NPs can be assembled in one, two and three-dimensions.

Figure 20A:
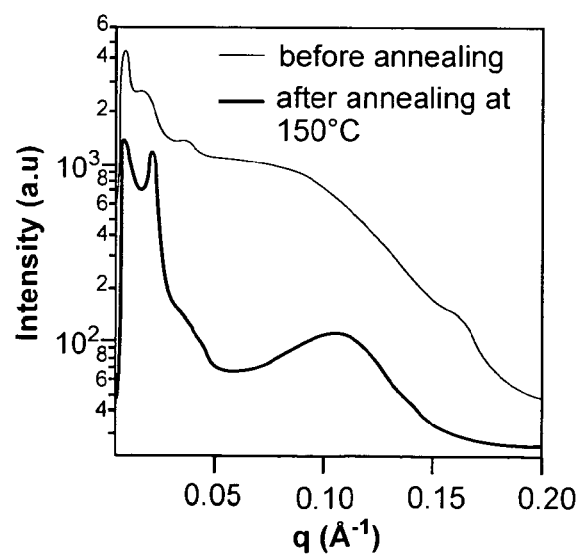
FIG. 20 SAXS profile (a) and TEM image (b) of a blend of PS(40)-b-P4VP(5.6)(PDP)$_2$ and ~4 nm CdSe nanoparticles before and after being annealed at 150° C. and slowly cooled to room temperature over 12 hrs.
Figure 20B:
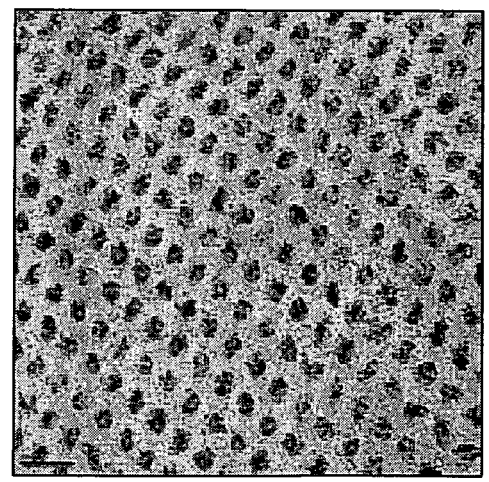

Since the bifunctional linking compounds are not covalently linked to the BCP, external stimuli can be used to strengthen or weaken the bonding between the bifunctional linking compounds and the BCP to tailor the polymer chain configuration and architecture, as well as to alter the spatial distribution and ordering of the bifunctional linking compounds. Stimuli-responsive bifunctional linking compounds can also be readily plugged-in. This opens unique opportunities to produce responsive materials where the assembly and spatial distribution of the NPs and the macroscopic properties of the NP assemblies can be altered by external stimuli. PS-b-P4VP(PDP)$_r$ supramolecules are thermoresponsive. The lamellae formed by the P4VP(PDP) comb-block melt at ~65° C.; the hydrogen bonding between the PDP and 4VP is stable up to 110° C. and at T>125° C., PDP is soluble in both PS and P4VP and can be redistributed between the microdomains, leading to morphological transitions of the supramolecular assembly. In the case of supramolecule/NP blend, the thermoresponsiveness of the supramolecule can lead to a change in the dimensionality and the overall arrangement of the NP assembly. Shown in FIG. 20 is an example where the redistribution of PDP changed CdSe NP assemblies from a stack of sheets into hexagonally packed cylinders.

Figure 22A:
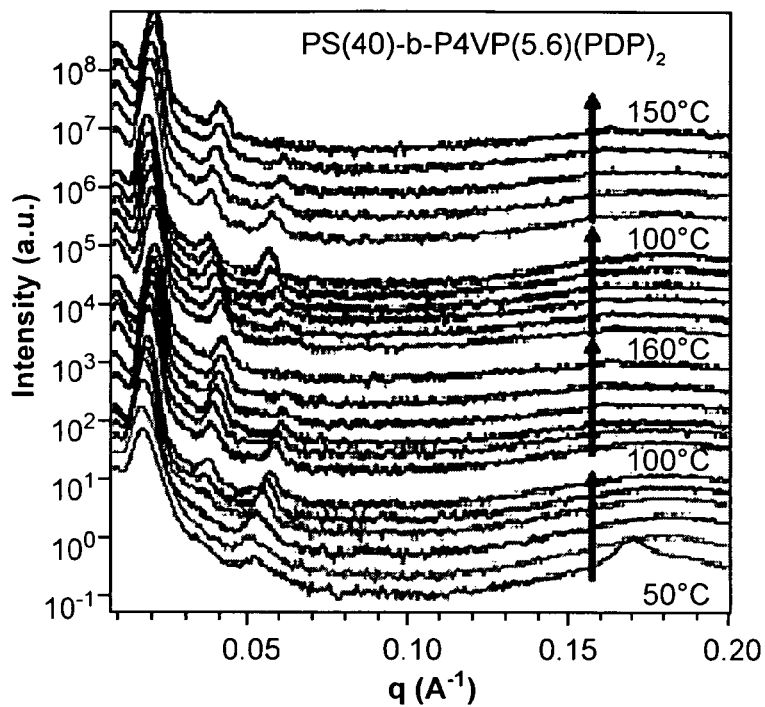
FIG. 22(a) In-situ SAXS profiles of PS(40)-b-P4VP(5.6) (PDP)$_2$ during two heating-cooling cycles.
Figure 22B:
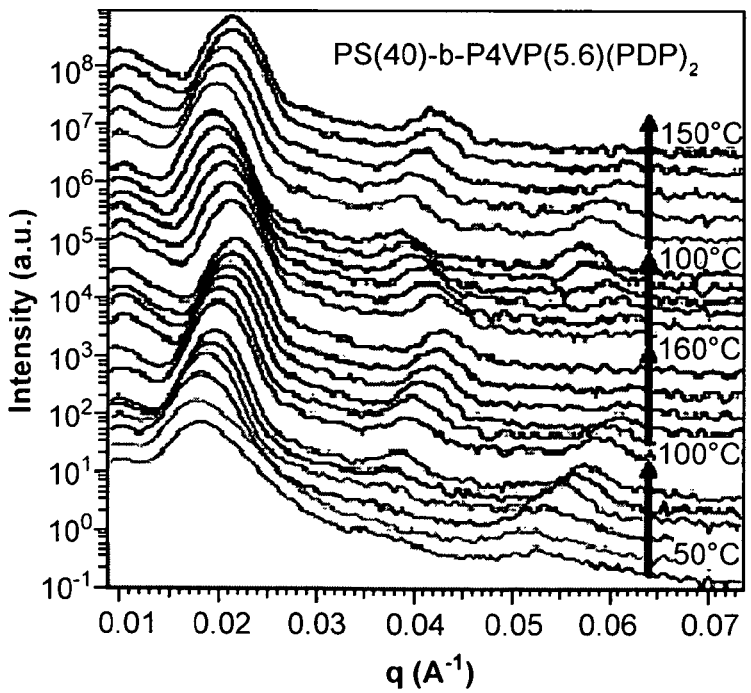
FIG. 22(b) shows an expanded view of the SAXS profiles at the low q region. The scattering profiles were shifted vertically for clarity. Red and blue indicate the heating and cooling process, respectively. The samples were heated from 50° to 160° C., cooled down to 100° C. and then heated to 150° C. again at heating and cooling rates of 10° C. per minute. The sample was equilibrated for 10 minutes before SAXS data were collected.
Figure 23:
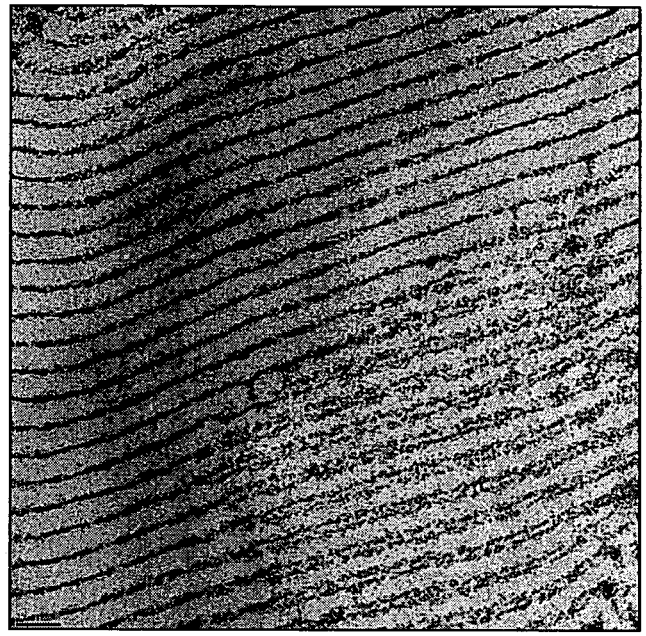
FIG. 23 TEM image of a blend of PS(40)-b-P4VP(5.6) (PDP)$_2$ and 5.4 nm PbS NPs showing both interfacial and domain center NP assemblies.
Figure 24:
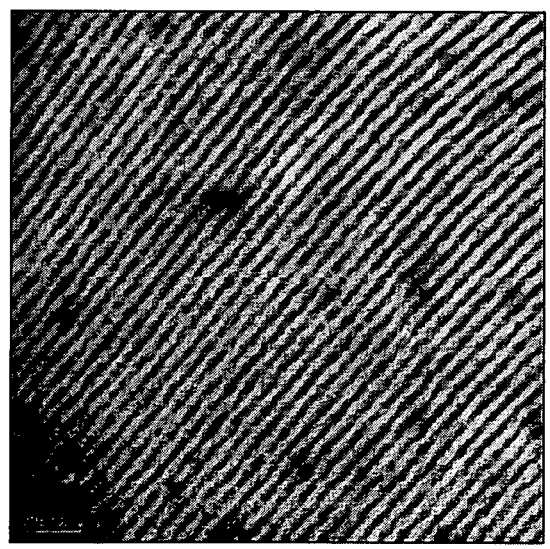
FIG. 24 TEM image of a PS(40)-b-P4VP(5.6)(PDP)$_2$ and ~4 nm CdSe NP blend quenched from 150° C.

Since the bifunctional linking compounds can precisely tailor the enthalpic interactions and entropy in the NP assembly process, external stimuli can be used to alter both and provide greater control over the NP assembly. FIG. 5(a) shows the in-situ SAXS profiles of a solvent-cast blend of PS(40)-b-P4VP(5.6)(PDP)$_2$ with the 4 nm CdSe (2 vol %). The sample was heated from 50° C. to 160° C. and then cooled to 50° C. Results for PS(40)-b-P4VP(5.6)(PDP)$_2$ alone are shown in FIG. 22. The electron density difference between the NP and PS(40)-b-P4VP(5.6)(PDP)$_r$ is much higher than that between the PS and P4VP(5.6)(PDP)$_r$ microdomains, so the SAXS profiles primarily reflect spatial distributions of the NPs. After the solvent casting, the broad reflections indicate that the sample is poorly ordered and in a non-equilibrium state. Upon heating to 90° C., the peak around $q=0.0167$ Å$^{-1}$ sharpens, corresponding to a lamellar periodicity of ~36.9 nm, as shown in the TEM image in FIG. 5(c). Between 100-110° C., this peak broadens and disappears with only a reflection at $q=0.0421$ Å$^{-1}$ evident. When the NPs assemble at the interfaces, the separation distance between the NP layers was almost half that of the lamellar period, as shown in the TEM image in FIG. 5(d) and at 110° C., and reflection at higher $q=0.042$ Å$^{-1}$ is seen. Upon increasing the temperature further, a peak at $q$~0.0218 Å$^{-1}$ appears, intensifies and shifts to higher q. The CdSe NPs are homogeneously distributed within the lamellar P4VP(PDP)$_r$ microdomains, as evidenced by the TEM image in FIG. 5(e) and in FIG. 24 after selective iodine staining. In the cooling cycle, a reverse process is observed. FIG. 5(b) shows the in-situ SAXS profiles of the same blend where the temperature was cycled between 100 and 160° C., confirming the reversibility of the process. Thus, using temperature as a handle to direct the PDP distribution, the location of the CdSe NPs was changed from the center of the P4VP(PDP)$_r$ lamellae, to the interfaces between the lamellae, and to a homogeneous dispersion in the P4VP(PDP)$_r$ lamellae. This process occurs within minutes and is fully reversible.

The in-situ SAXS studies demonstrate the power bifunctional linking compounds in tailoring the thermodynamics of the NP assemblies and the versatility of the approach. The diverse nature of the NP assemblies and transitions shown reflect the delicate balance between the enthalpic and entropic contributions to the assembly NPs upon blending with bifunctional linking compounds and BCPs. The favorable interactions between the PDP and the NP ligands and its non-favorable interactions with PS provide an enthalpic driving force to incorporate the NP into the P4VP(PDP)$_r$ microdomains. This is seen in the SAXS below 100° C. As PDP solublizes in the PS-rich domain, PDP mediates the PS-NP interactions, reducing the driving force for selective incorporation. There is also a cross-sectional mismatch between the PS coil-block and P4VP(PDP)$_r$ comb-block that requires the PS chains to be more extended at the interface, in comparison to coil-coil BCPs, which, also, increases the enthalpic contribution to the free energy. By localizing the NPs at the interface between the coil- and comb-blocks, non-favorable interfacial interactions are mediated and entropic penalties associated with the PS chain deformation are reduced. The ramifications of these are evident in the data at 110° C. were the interfacial assembly of the NPs is stabilized. Further increasing the temperature enhances the solubility of PDP in the PS-rich domain. However, hydrogen bonding between PDP and 4VP is destabilized and the stiffness of the P4VP (PDP)$_r$ comb-block is decreased. Consequently, the entropic driving force for the interfacial assembly is reduced and the NPs are homogeneously distributed in the P4VP(PDP)$_r$ domains at 150° C.

Figure 6A:
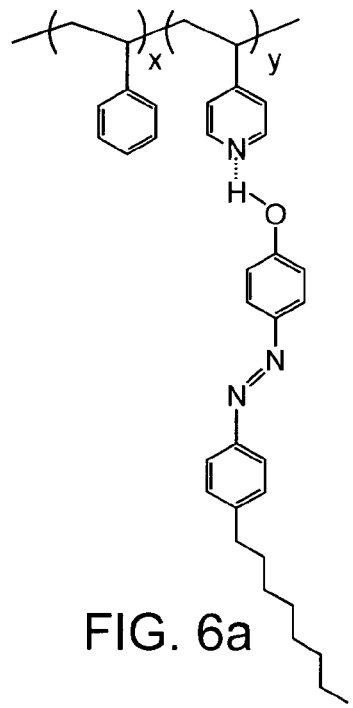
FIG. 6(a) chemical structure of trans-OPAP hydrogen bonding to the 4VP in PS-b-P4VP; (b) TEM image of a blend of PS(40)-b-P4VP(5.6)(trans-OPAP)$_{1.5}$ and 7 nm PbS NPs (2 vol %) (Scale bar: 100 nm); (c) SAXS profiles of a blend of PS-b-P4VP(OPAP)$_{1.5}$ and PbS NPs (2 vol %) where the OPAPs went through isomerization from the trans- (blue) to cis- (red) and back to trans-state (black). Inset shows the zoom in view of the SAXS profiles at the low q region. The trans-cis isomerization of OPAP induced a change in the periodicity of the NP assemblies from 37.4 nm to 32.9 nm. This is a difference of 4.5 nm or ~12% of the original lamellar spacing. The trans-cis isomerization also lead to a ~0.6 nm reduction in the lamellar assembly of the P4VP(5.6)(0PAP)$_{1.5}$ comb block. With subsequent annealing under UV exposure at 419 nm, the cis-trans isomerization changed the NP assembly back.
Figure 6B:
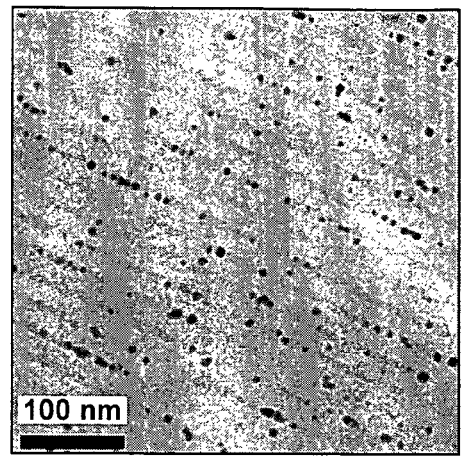
Figure 6C:
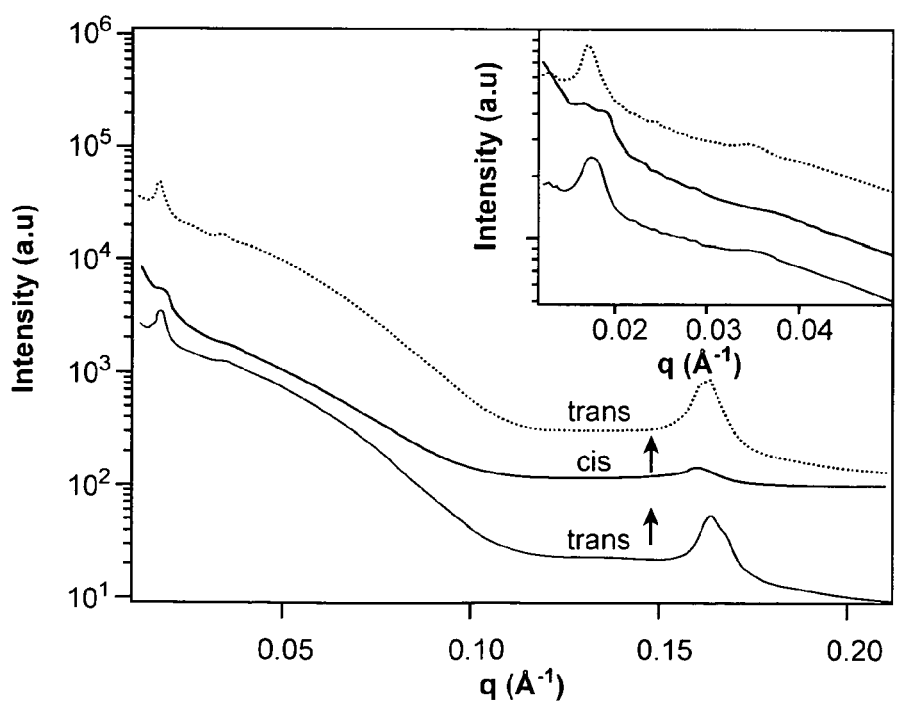

The versatility of this approach lies in the non-covalent linkage between the bifunctional linking compound and BCP that allows the system to respond to external stimuli, temperature in this case, and provides a simple means of controlling the local environment of the NPs, the packing density of the NPs and the interparticle separation distance and ordering. A wide range of supramolecules have been constructed using a variety of non-covalent linking schemes other than the hydrogen bonding used here, including electrostatic interactions or metal ligation. In principle, similar types of re-organization may occur. Different bifunctional linking compounds with built-in responsiveness or functionality can also be substituted for PDP. A light-responsive bifunctional linking compound, 4-(4'-Octylphenyl)azophenol (OPAP) was attached to 4VP, forming a PS(40)-b-P4VP(5.6)(OPAP)$_{1.5}$ supramolecule as shown in FIG. 6(a). Similar to PDP, the phenol end-group in OPAP hydrogen bonds to the 4VP unit in the BCP and the alkyl tail compatibilizes the NP's alkyl ligand. The azobenzene group responds to the light exposure and goes through a trans-cis isomerization when exposed to 352 nm UV light and a cis-trans isomerization with exposure to 419 nm radiation. The TEM image of PS(40)-b-P4VP(5.6) (OPAP)$_{1.5}$/PbS blend (~2 vol %) in FIG. 6(b) and the SAXS profile in FIG. 6(c) show that PbS NPs assembled in the center of P4VP(OPDP)$_{1.5}$ lamellae. Upon annealing under 352 nm UV exposure, OPAP goes through a trans-cis isomerization and altered the periodicity of the PbS NP assembly from 37.2 nm to 32.9 nm, a more than a 10% change in the periodicity of the NP assembly, as seen in the SAXS profiles in FIG. 6(c). With subsequent annealing under 419 nm UV exposure, OPAP transformed back to the trans-state and the NP assembly reverted to that seen in the initial PS(40)-b-P4VP(5.6) (OPAP)$_{1.5}$/PbS blend. Thus, the light-responsive bifunctional linking compounds can be used to obtain responsive nanocomposite and the process was found to be fully reversible.

IV. Examples

The following examples are offered to illustrate, but not to limit the claimed invention.

Block copolymers (PS-b-P4VP) were purchased from Polymer Source, Inc. 3-n-pentadecylphenol (PDP) (95%) was purchased from Acros. Chloroform was purchased from Fisher. All chemicals were used as received. PS-b-P4VP, was first dissolved in chloroform to form 1%-2% (wt/v) stock solutions. The desired amount of PDP was dissolved in chloroform. The PDP solution was then added drop-wise to the PS-b-P4VP solution, followed by stirring overnight. Dried nanoparticle (NP) powder was weighed and dissolved in chloroform. The solutions were centrifuged at 10,000 rpm for 5 minutes before mixing with the PS-b-P4VP(PDP)$_r$ chloroform solution. The NP concentrations were re-measured based on their optical absorption.

Figure 7:
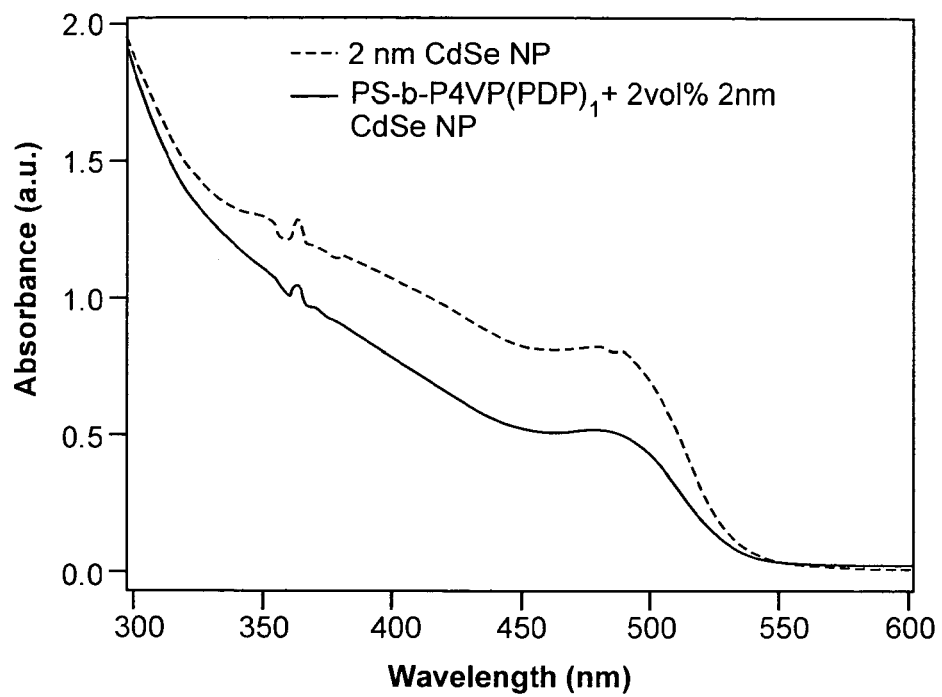
FIG. 7 UV-vis spectra of 2 nm CdSe NPs (dotted) and its' blend with PS-b-P4VP(PDP)$_1$ (solid) in chloroform solutions.
Figure 8A:
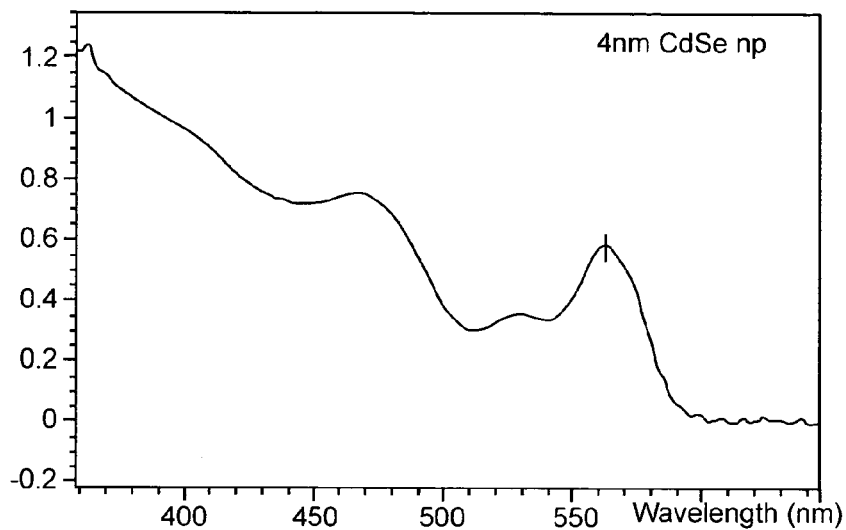
FIG. 8 UV-vis spectra of 4 nm CdSe NPs (a) and its' blend with PS-b-P4VP(PDP)$_1$ (b) in chloroform solutions.
Figure 8B:
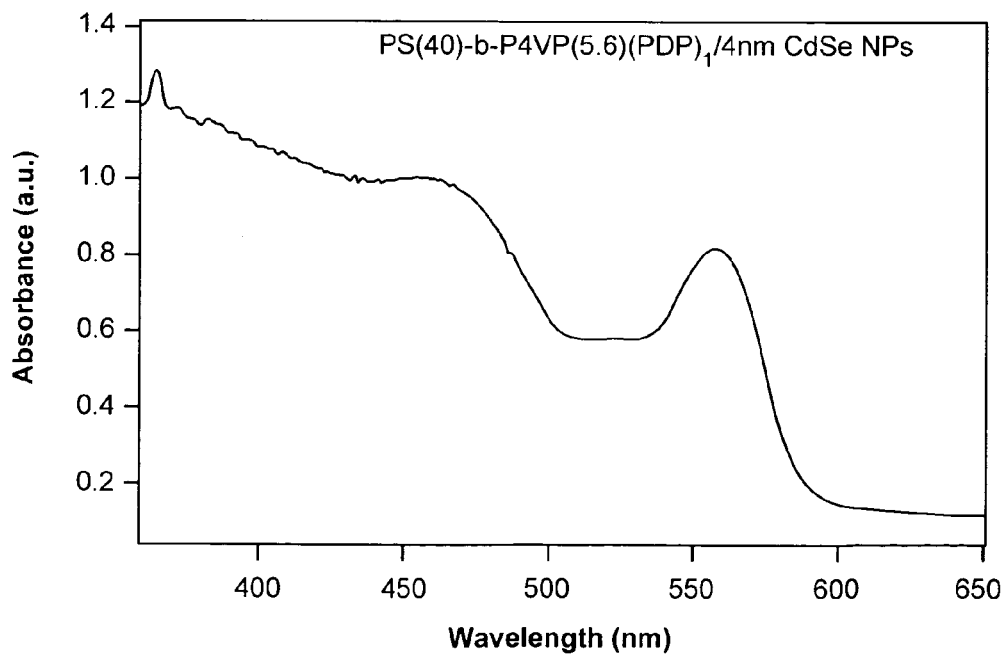

There are no changes in the NP UV-vis spectra upon mixing with PS-b-P4VP(PDP)$_r$ as shown in FIG. 7. The PS-b-P4VP(PDP)$_r$ and NP solutions were mixed and stirred for one day, then cast and dried in a Teflon beaker at room temperature, allowing the solvent to slowly evaporate over 48 hrs. The blend was then annealed at ~100-110° C. under vacuum for 12 hrs and slowly cooled to room temperature. The sample was embedded in resin and cured at 60° C. overnight before being microtomed for TEM imaging.

Example 1

PS-b-P4VP Assemblies with PDP

Sample preparation: Block copolymers (PS-b-P4VP) were purchased from Polymer Source, Inc. 3-n-pentadecylphenol (PDP) (95%) was purchased from Acros. Chloroform was purchased from Fisher. All chemicals were used as received. PS-b-P4VP, was first dissolved in chloroform to form 1%-2% (wt/v) stock solutions. The desired amount of PDP was dissolved in chloroform. The PDP solution was then added drop-wise to the PS-b-P4VP solution, followed by stirring overnight. Dried nanoparticle (NP) powder was weighed and dissolved in chloroform. The PS-b-P4VP(PDP)$_r$ and NP solutions were mixed and stirred for one day, then cast and dried in a Teflon beaker at room temperature, allowing the solvent to slowly evaporate over 48 hrs. The blend was then annealed at ~100-110° C. under vacuum for 12 hrs and slowly cooled to room temperature.

TEM: Samples were embedded in resin (Araldite 502, Electron Microscopy Sciences, Inc.) and cured at 60° C. overnight. Thin sections about 60 nm in thickness were microtomed using an RMC MT-X Ultramicrotome (Boeckler Instruments, Inc) and picked up on copper TEM grids on top of water. The thin sections were imaged using FEI Tecnai 12 TEM at the accelerating voltages of 120 or 200 kV.

TEM Tomography measurements were carried out using a JEM-2200FS (JEOL Co., Ltd., Japan) operated at 200 kV, equipped with a slow-scan CCD camera (Gatan USC4000, Gatan, Inc., USA). A series of TEM images were acquired at tilt angles ranging over ±70° at an angular interval of 1°. Subsequently, the tilt series of the TEM images was aligned by the fiducial marker method using gold nanoparticles as the fiducial markers and then reconstructed on the basis of the filtered-back-projection (FBP) method.

SAXS: SAXS studies were performed at the Advanced Light Source beamline 7.3.3. X-rays with a wavelength of 1.240 Å (10 keV) were used. Spectra were collected on an ADSC Quantum 4u CCD detector with an area of 188×188 mm (2304×2304 pixels). Samples for in-situ SAXS measurements were mounted in a standard differential scanning calorimetry (DSC) pan which was used as a heating stage during scanning.

Sample Preparation for FIG. 5d and FIG. 5e: For samples shown in FIG. 5d and FIG. 5e, the samples were treated with the thermal histories described in the figure caption, using the same type of DSC pan as those used in the SAXS measurements. The samples were quenched by dipping into liquid nitrogen, embedded in cold-setting resin (Epofix, Electron Microscopy Sciences Inc), and microtomed as described above.

Figure 9:
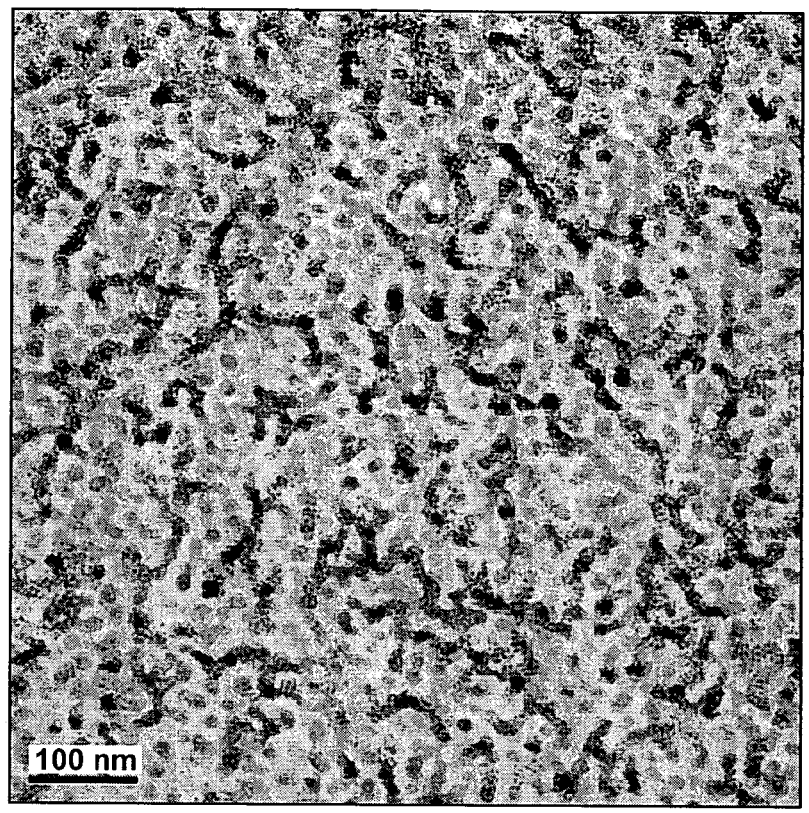
FIG. 9 TEM image of a blend of PS(40)-b-P4VP(5.6) and ~4 nm CdSe NPs.
Figure 10:
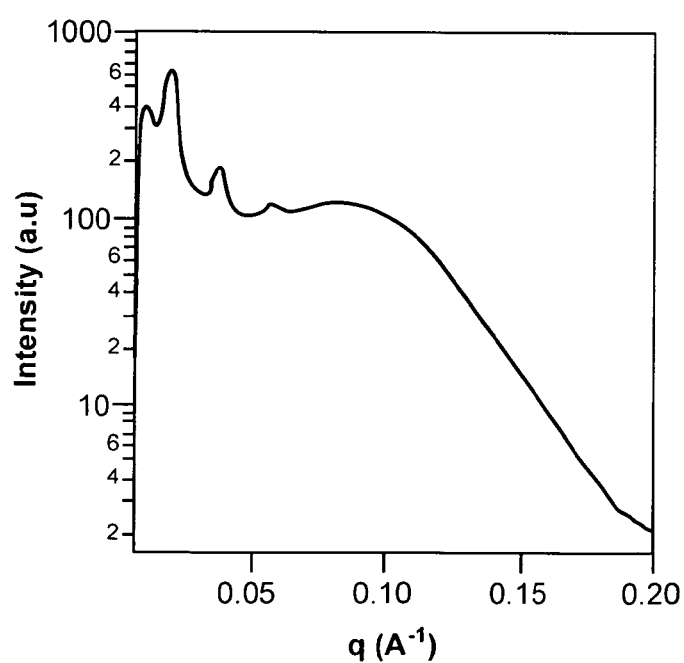
FIG. 10 Small angle X-ray scattering (SAXS) profile of a blend of PS(40)-b-P4VP(5.6)(PDP)$_1$ and ~4 nm CdSe NPs (2 vol %).

PS-b-P4VP assemblies without PDP. FIG. 9 shows the TEM image of a blend of PS(40)-b-P4VP(5.6) and ~4 nm CdSe dots without the addition of PDP. PS(40)-b-P4VP(5.6) forms a spherical morphology. Clusters of CdSe NPs are seen. Thus, without PDP, CdSe NPs can not be dispersed in the BCP morphology.

Figure 11:
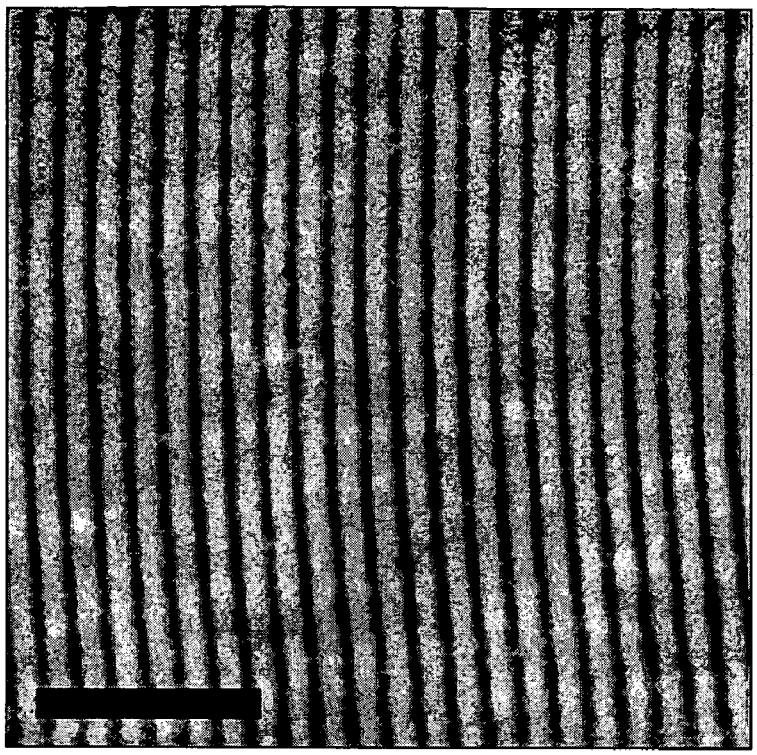
FIG. 11 TEM of PS(40)-b-P4VP(5.6)(PDP)$_2$/CdSe blend stained with I$_2$. (Scale bar: 200 nm) Degradation of CdSe NPs upon exposing I$_2$ can be clearly seen.
Figure 12:
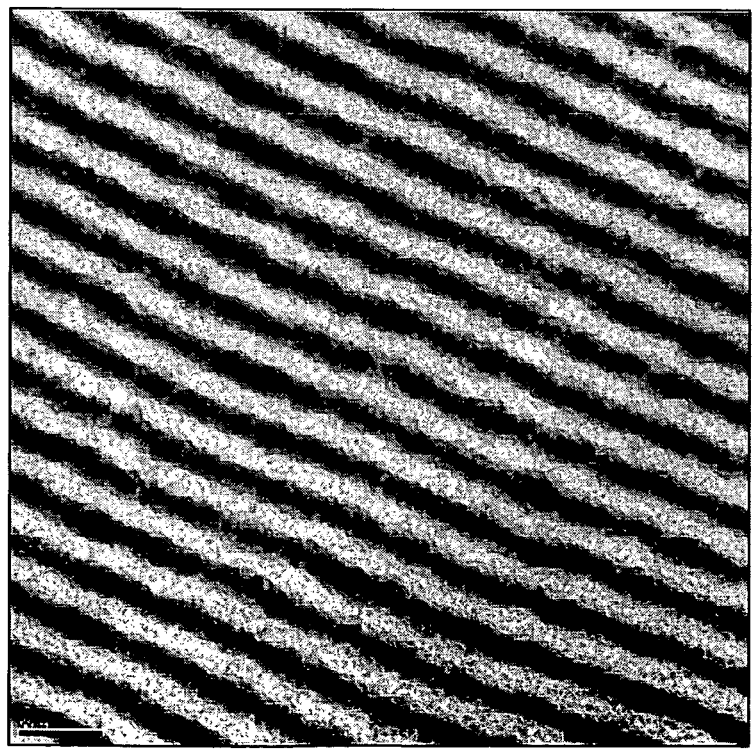
FIG. 12 TEM of PS(40)-b-P4VP(5.6)(PDP)$_2$/PbS blend stained with I$_2$. (Scale bar: 50 nm) Degradation of PbS NPs upon exposing I$_2$ can be clearly seen.

Identifying the NP location within the PS-b-P4VP(PDP)$_r$ assemblies. A thin section of the PS-b-P4VP(PDP)$_2$/CdSe or PS-b-P4VP(PDP)$_2$/PbS blend was exposed to the iodine vapor for 30 seconds and imaged using TEM. Iodine selectively stains the P4VP(PDP)$_r$ domains. FIG. 11 and FIG. 12 show that the NPs were selectively incorporated in the P4VP (PDP)$_r$ microdomain and that most of NPs were localized in the center of the P4VP(PDP)$_r$ lamellae.

Size/Shape dependence of NP spatial distribution. TEM images were acquired of a PS-b-P4VP(PDP)$_2$/Au NP blend where the Au NP size ranged from ~3-18 nm. The corresponding ratio between the NP diameter and the supramolecule period, $d/L_0$, is from 0.09-0.45. The sample was exposed to a trace amount of iodine which selective stains P4VP(PDP). The NPs with small diameter can still be seen. FIG. 13 shows the Au NPs were selectively incorporated in the P4VP(PDP)$_2$ microdomain even though the nanoparticle size distribution is fairly large.

Figure 14:
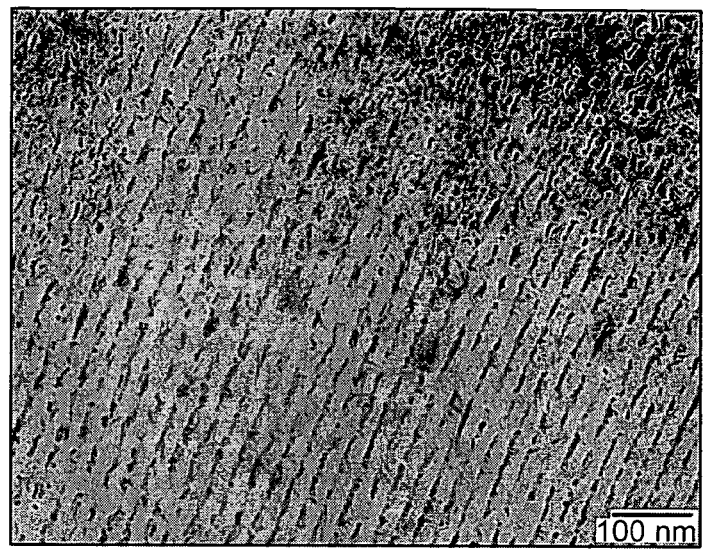
FIG. 14 TEM image of a PS-b-P4VP(PDP)$_2$/CdSe nanorod blend (scale bar: 100 nm).

FIG. 14 shows a TEM image of a PS-b-P4VP(PDP)$_2$/CdSe nanorod (4×30 nm) blend where the CdSe nanorods were selectively incorporated in the P4VP(PDP)$_2$ microdomain.

Figure 15:
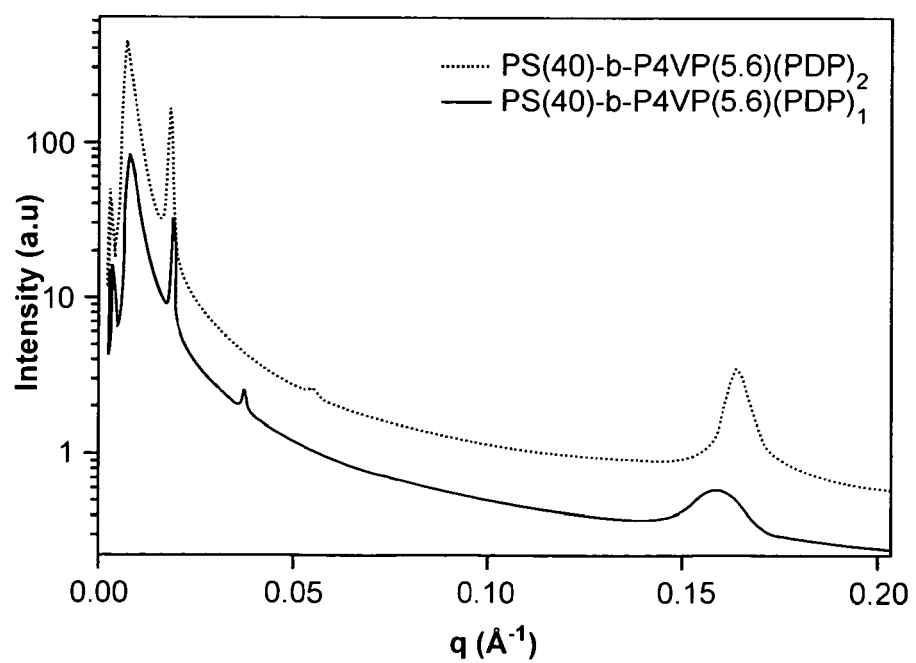
FIG. 15 SAXS profiles of PS(40)-b-P4VP(5.6)(PDP)$_r$, where r=1 (bottom) and 2 (top). The diffraction peaks at q~0.16 Å$^{-1}$ correspond to the lamellae spacing formed by the P4VP(5.6)(PDP), comb blocks. For r=2, the diffraction peak is much sharper, confirming that the comb blocks order better at r=2.

PS-b-P4VP(PDP)$_r$ assemblies without nanoparticles. FIG. 15 shows the SAXS profiles of PS-b-P4VP(PDP)$_r$, where r=1 and 2. The diffraction peak at q~0.16 Å$^{-1}$ corresponds to the lamellae formed by the P4VP(PDP) comb blocks. At r=2, the peak intensity is higher than that of r=1 and the FWHM of the diffraction peak reduces significantly. Thus the ordering of the P4VP(PDP), lamellae improves significantly at r=2. This leads to better ordering in the NP assemblies as shown in FIG. 3.

Figure 16A:
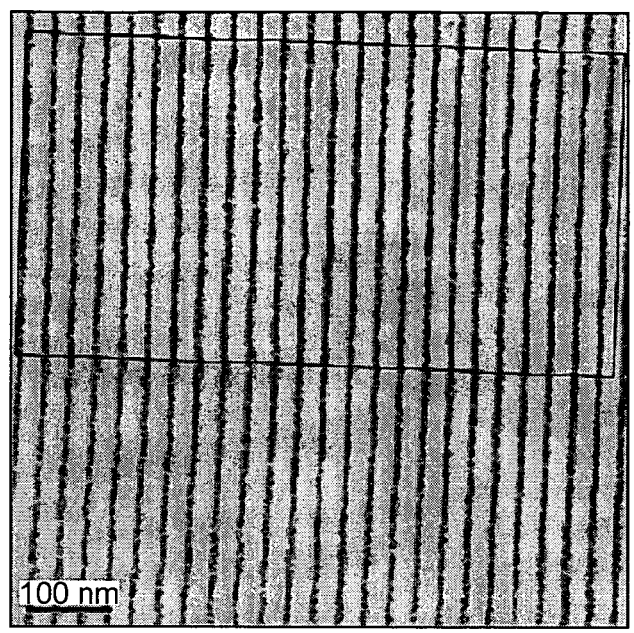
FIG. 16(a) A TEM image of PS-b-P4VP(PDP)$_2$ and ~4 nm CdSe NPs. Boxed area indicates area over which image analysis was performed. (b) Averaged intensity profile obtained using ImageJ; (c) The intensity profile after subtracting background; and (d) The average intensity profile showing the spatial distribution of CdSe within PS-b-P4VP (PDP)$_2$. The FWHM, 6.68 nm, represents ~67% of the CdSe NP size in the particle distribution deviation within the P4VP (PDP)$_2$ lamellae.
Figure 16B:
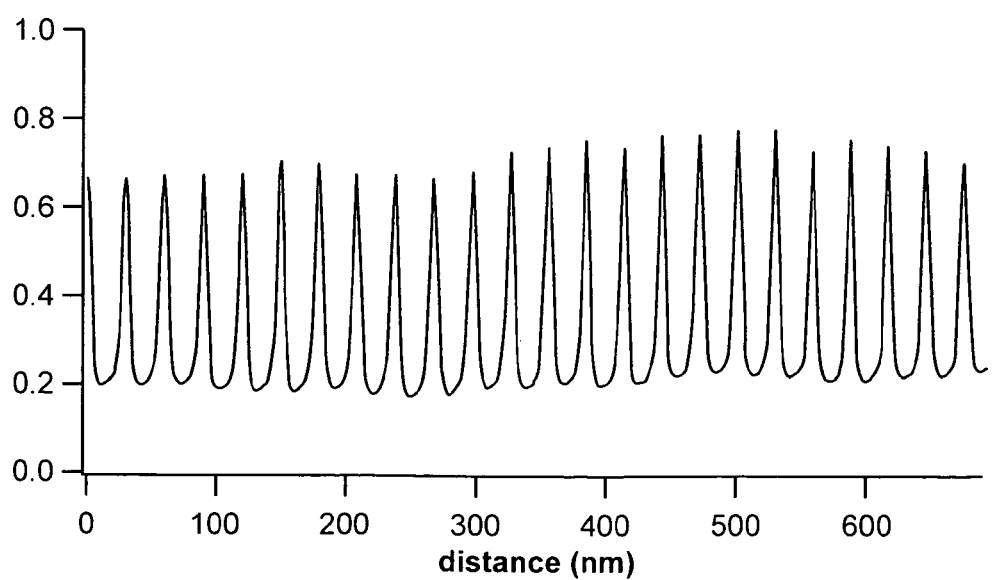
Figure 16C:
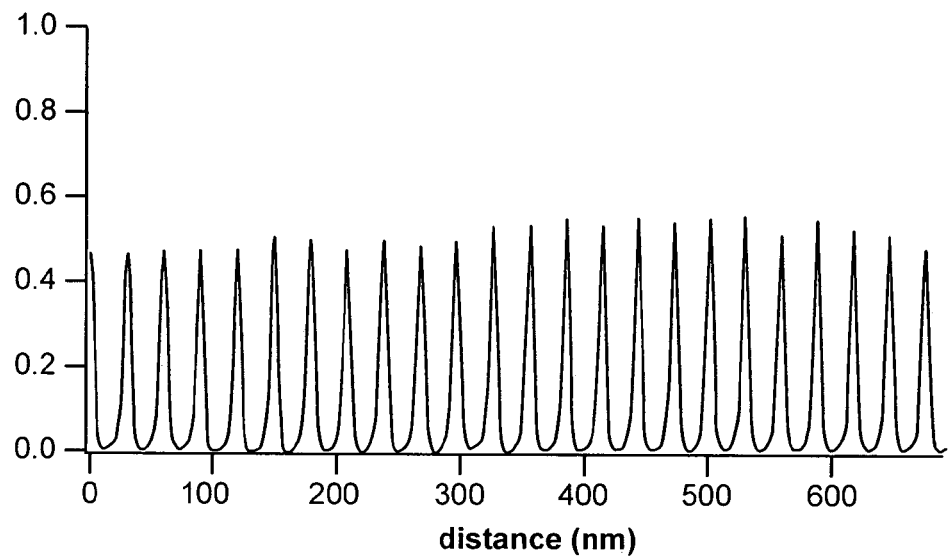
Figure 16D:
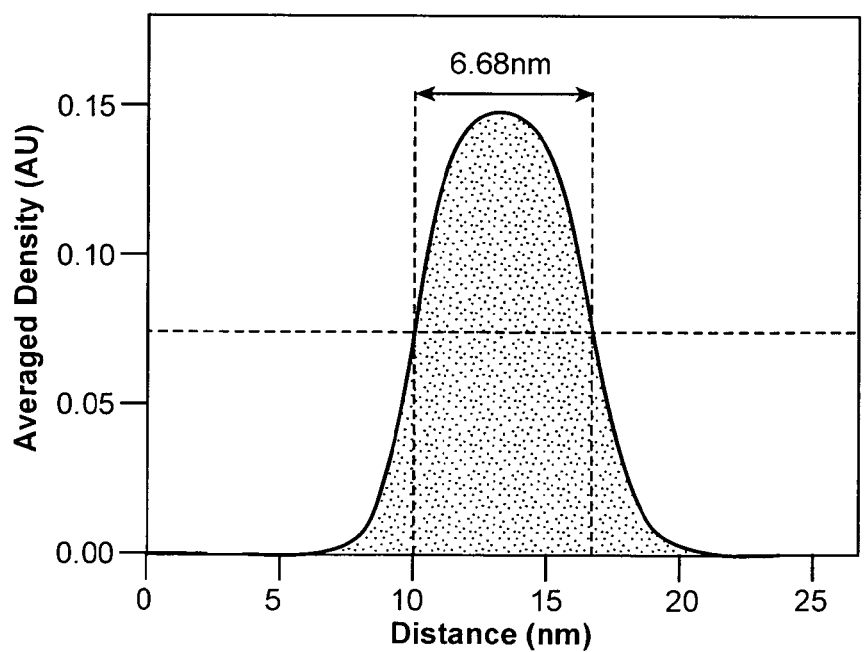
Figure 17A:
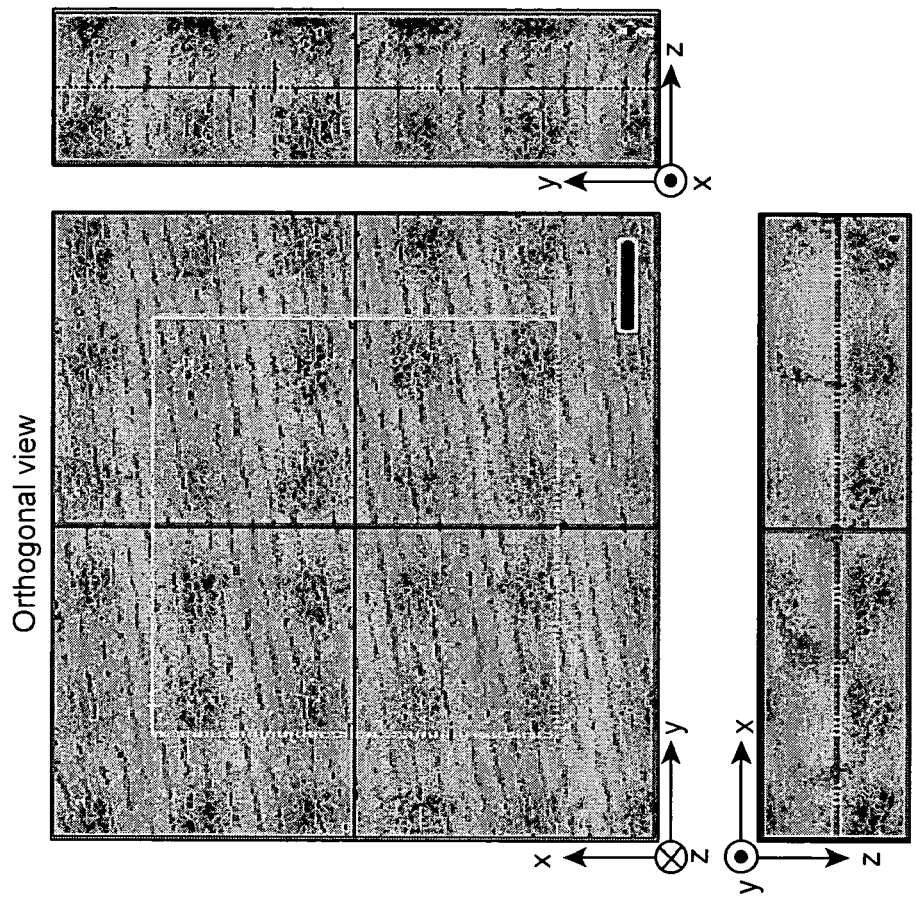
FIG. 17 shows the orthogonal view of a PS-b-P4VP(PDP)$_2$ and ~5.4 nm PbS NP composite (a) and two snapshots of the TEM tomography (TEMT) ((b) and (c)). The specimen thickness was 130 nm. The X and Y axes correspond to parallel to the surface of the specimen. The Z axis corresponds to electron beam direction. The XY sliced image is the same position as the TEM image. The scale bar is 100 nm. It can be clearly seen that the PbS NPs assembled into a sheet-like morphology, ~7 nm in thickness and ~36 nm in periodicity.
Figure 17A:
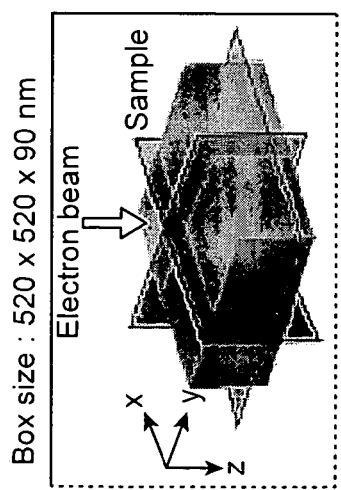

Analysis of nanoparticle spatial distribution within the BCP microdomains. The spatial distribution of the NPs was quantified using open-access software "ImageJ," provided freely by the NIH at rsbweb.nih.gov. A TEM image, as shown in FIG. 16(a), was selected, where the lamellar nanoparticle assemblies are viewed edge-on. The intensity scale was arbitrarily defined, based on the grayscale of the image, to range from 0, which indicates white, to 1, which indicates black. The NPs have a significantly higher electron density than that of PS-b-P4VP(PDP)$_r$. Thus, high intensity indicates the presence of NPs. The TEM images were averaged along the lamellae and the intensity profile was plotted as a function of distance as shown in FIG. 16(b). To remove the background contrast due to the TEM sample preparation, linear lines connecting the lowest points between the peaks is fitted and subtracted from the intensity profile. A periodic set of peaks representing NP spatial distribution is obtained as shown in FIG. 16(c). These peaks are then averaged together. This is accomplished by first finding the maximum of each peak, then using the locations of these points to calculate the average periodicity of the lamellae. The intensity of each peak is then normalized so the integral of the profile over a single period is 1. The averaged intensity profile is shown in FIG. 16(d) and the full width at half maximum (FWHM) can be readily calculated.

TEM tomography of a blend of PS-b-P4VP(PDP)$_2$ and ~5.4 nm PbS NPs. The TEMT 3D measurements were carried out using a JEM-2200FS (JEOL Co., Ltd., Japan) operated at 200 kV and equipped with a slow-scan CCD camera (Gatan USC4000, Gatan, Inc., USA). Only the transmitted and elastically scattered electrons (electron energy loss of 0±15 eV) were selected by the energy filter (Omega filter, JEOL Co., Ltd., Japan). A series of TEM images were acquired at tilt angles ranging over ±70° at an angular interval of 1°. Subsequently, the tilt series of the TEM images was aligned by the fiducial marker method using gold nanoparticles as the fiducial markers and then reconstructed on the basis of the filtered-back-projection (FBP) method.

Example 2

Thin Films of a PS-b-P4VPPDP$_3$ and ~6 nm CoFe$_2$O$_4$ Blend

Thin films (~60nm) of a PS(40)-b-P4VP(5.6)(PDP)$_3$ and ~6 nm CoFe$_2$O$_4$ NP blend were prepared by spin coating the solution onto a silicon nitride membrane. The thin films were solvent annealed under a chloroform atmosphere for 48hrs and imaged using TEM. Since the chloroform selectively swells the PS microdomain, PS(40)-b-P4VP(5.6)(PDP)$_3$ forms lamellar morphology in thin films. The hierarchical assembly of CoFe$_2$O$_4$ can be clearly seen where the lamellar BCP morphology directs CoFe$_2$O$_4$ NP assemblies within the lamellae and the CoFe$_2$O$_4$ NPs forms a sheet-like morphology, mostly one particle in width.

Morphology of PS(40)-b-P4VP(5.6)(PDP)$_3$. FIG. 19 shows a TEM image of PS(40)-b-P4VP(5.6)(PDP)$_3$ forming a morphology with hexagonally packed PS-rich cylinders in a P4VP(PDP)$_3$ matrix. The sample was imaged without staining. P4VP(PDP), has lower electron density and appears lighter.

TEM tomography of a blend of PS-b-P4VP(PDP)$_3$ and ~5.4 nm PbS NPs. FIG. 21(a) shows the orthogonal view of a PS-b-P4VP(PDP)$_3$ and ~5.4 nm PbS NP composite, and a snapshot of the TEM tomography. This shows the NPs assembled within the P4VP(PDP)$_3$ matrix, forming hexagonal grids. The specimen thickness was 120 nm. The X and Y axes are parallel to the surface of the specimen. The Z axis corresponds to the electron beam direction. The XY sliced image is the same position as the TEM image. The scale bar is 100 nm.

Figure 21C:
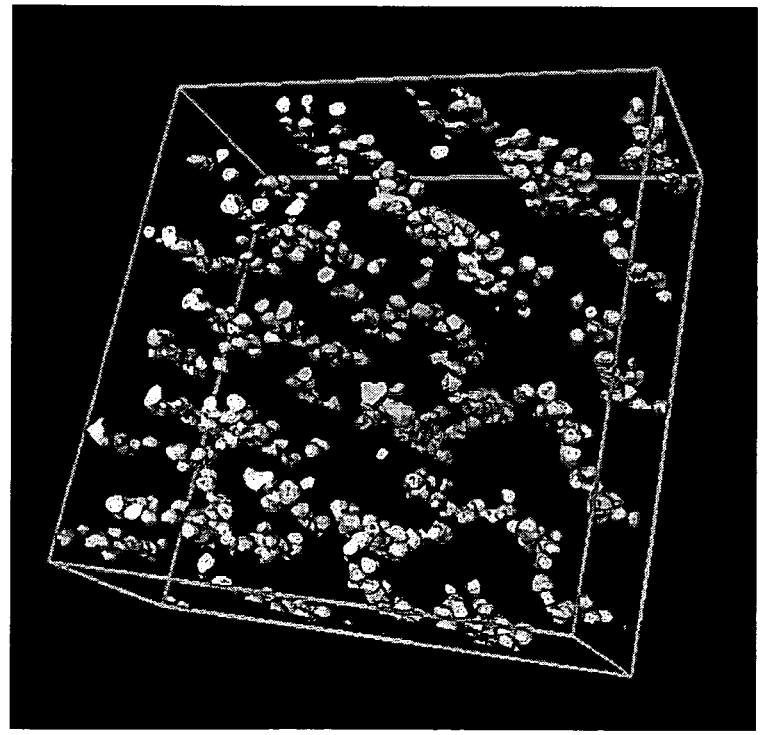
FIG. 21(c) TEM Tomography of a PS-b-P4VP(PDP)$_3$ and ~5.4 nm PbS NP composite. Shown is an area with relatively low NP loading. (box size: 130×130×55 nm).

FIG. 21(b) and FIG. 21(c) show the orthogonal view of a PS-b-P4VP(PDP)$_3$ and ~5.4 nm PbS NP composite and a snapshot of the TEM tomography in a region with low NP loading. The specimen thickness was 80-90 nm. The X and Y axes correspond to the surface of the specimen. The Z axis corresponds to the electron beam direction. The XY sliced image is the indicated in TEM image. PbS NPs selectively sequestered at the corners of the hexagonal grids can be clearly seen.

Example 3

Thermoresponsive Lamellae-to-cylinder Transition in a Blend of PS(40)-b-P4VP(5.6)(PDP), and ~4 nm CdSe NPs FIG. 20 shows the SAXS and TEM image of a blend of PS(40)-b-P4VP(5.6)(PDP)$_2$ with 4 nm CdSe NPs (2% vol.) after annealing at 150° C. under vacuum and slow cooling to room temperature over 12 hrs. The sample was exposed to iodine vapor for 30 seconds, selectively staining the P4VP (PDP)$_r$ microdomain. The re-distribution of the PDP transformed the spatial distribution of CdSe from lamellae to hexagonally packed cylinders. However, the CdSe NPs are randomly distributed within the cylindrical microdomains, similar to that seen previously in blends of BCP with NPs since a large fraction of PDP is no longer hydrogen bonded to the 4VP. These findings underscore the importance of the molecular ordering of the bifunctional linking compounds and their distribution within the BCP morphology to direct the spatial distribution and ordering of the NPs.

In-situ SAXS study of PS(40)-b-P4VP(5.6)(PDP)$_2$. PS(40)-b-P4VP(5.6)(PDP)$_2$ forms a lamellae-within-lamellae hierarchical assembly at 50° C. as shown in the SAXS profile. The periodicity of the BCP lamellar morphology is ~36 nm and the lamellae resulting from the assembly of P4VP(PDP)$_2$ comb block is ~3.7 nm. The intensity of the $2^{nd}$ order diffraction is much lower than that of the $3^{rd}$ order, indicating the domain sizes of the PS and P4VP(PDP) lamellae are almost symmetric. Upon heating, the P4VP(PDP)$_2$ lamellae melt at ~60° C. At T>80° C., the BCP lamellar periodicity starts to reduce. At T=100° C., the $2^{nd}$ order diffraction peak intensifies, suggesting the sizes of PS and P4VP (PDP)$_r$ microdomains are no longer symmetric. As the temperature increases, the solubility of PDP in the PS domain increases. The in-situ SAXS profile indicated that the trace amount of free PDPs becomes soluble in the PS domain at T>100° C. Upon further increasing temperature, the hydrogen bonding between the PDP and 4VP starts to break at T>110° C. and the solubility of PDP in the PS domain increases. The $2^{nd}$ order diffraction peak intensifies and the intensity of the $3^{rd}$ order of diffraction decreases. At 150° C., the $3^{rd}$ order diffraction almost disappears, suggesting the interface between the PS-rich and P4VP(PDP)r microdomains widens and the long-range order of the BCP assembly decreases, since the redistribution of PDP mediates the nonfavorable interactions between the PS and P4VP(PDP)$_r$. Upon cooling, the solubility of PDP in the PS domain decreases and the PDP returns to the P4VP(PDP)$_r$ domains, as seen in the SAXS profiles. The in-situ SAXS profiles of the heating and cooling cycle indicate this thermoresponsive process is reversible.

Example 4

TEM Study of a Blend of PS(40)-b-P4VP(5.6)(PDP)$_2$ and ~5.4 nm PbS NPs

In the blend of 5.4 nm PbS (7% by volume) and PS(40)-b-P4VP(5.6)(PDP)$_2$, mixtures of NP assemblies were observed. The PbS nanoparticles were sequestered either in the center of the lamellae or at the interfaces between the lamellae as shown.

Example 5

TEM Study of a Blend of PS(40)-b-P4VP(5.6)(PDP)$_2$ and ~4 nm CdSe NPs Quenched from 150° C.

The PS(40)-b-P4VP(5.6)(PDP)$_2$ and ~4 nm CdSe NP blend was quenched to room temperature after being annealed at 150° C. The sample was embedded in epoxy resin and cured at 60° C. before being microtomed at room temperature. Before the TEM imaging, the sample was exposed to I$_2$ vapor for 30 sec that selectively stains the P4VP(PDP)$_r$ domains. CdSe NPs are seen to be homogeneously distributed in the P4VP(PDP)$_r$ microdomains. However, the NPs are randomly distributed with in the lamellae and there is no inter-particle ordering with in the lamellae. Upon heating at 150° C., hydrogen bonding between the PDP and 4VP are broken and the P4VP(PDP)$_r$ assumes a stretched random coil conformation, providing less control over the NP ordering within the lamellar microdomain.

Example 6

Figure 25:
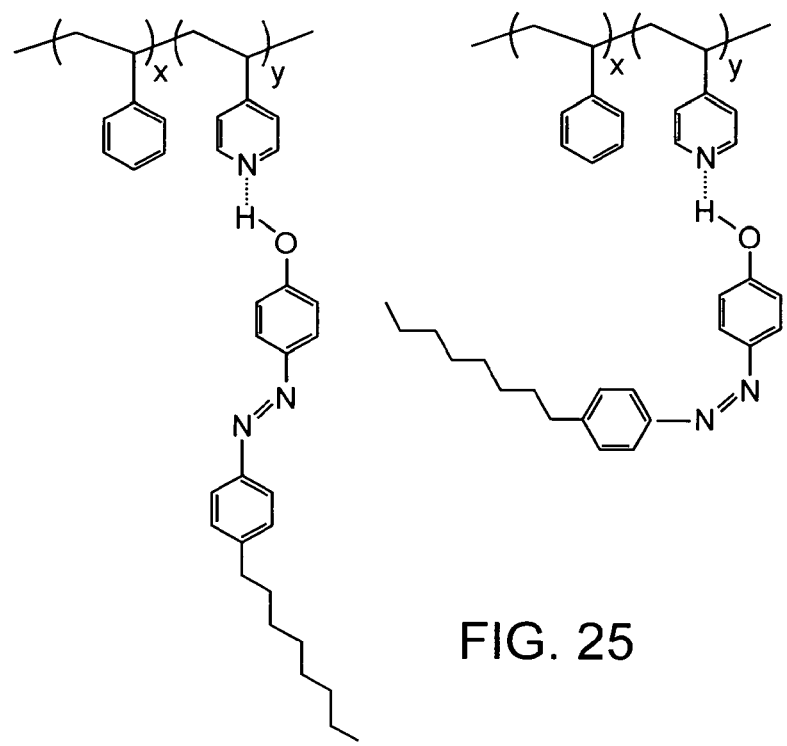
FIG. 25 Chemical structures of PS-b-P4VP(OPAP)$_1$ constructed using OPAP in a trans-state (a) and cis-state (b).
Figure 27A:
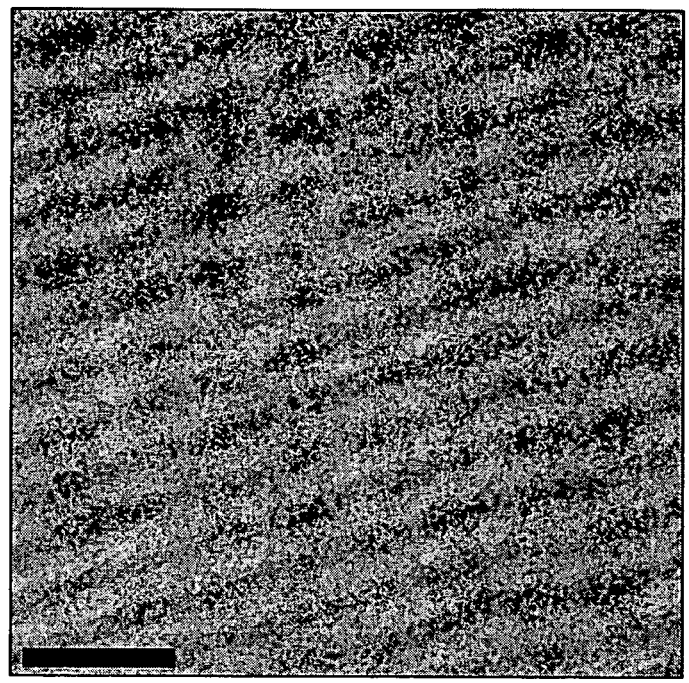
FIG. 27 TEM image (*a*) and SAXS profile (*b*) of a PS-b-P4VP(trans-OPAP)$_{1.5}$. The sample was stained with iodine. (Scale bar: 100 nm) SAXS profile of PS-b-P4VP(cis-OPAP)$_{1.5}$ is also shown.
Figure 27B:
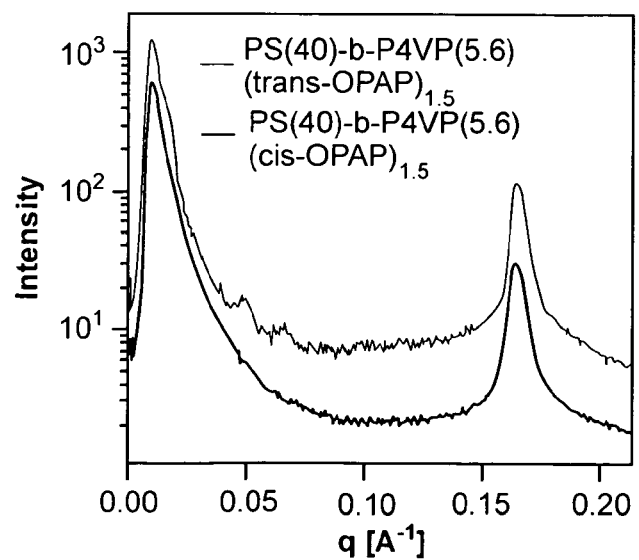
Figure 30A:
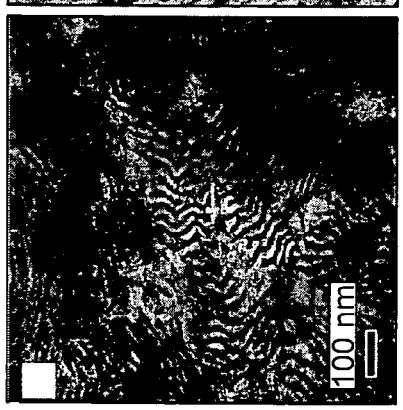
FIG. 30 Variation of bifunctional linking compound type: TEM images of PS(40 kDa)-b-P4VP(5.6 kDa)-bifunctional linking compound composites containing various bifunctional linking compounds and nanoparticles. a) contains a 1:1.5 mixture of 4VP:4T and PbS nanoparticles, b) contains a 1:1.5 mixture of 4VP:8PAP and Au nanoparticles, and c) contains a 1:2.5:0.5 mixture of 4VP:PDP:FDP and CdSe nanoparticles. Below each image are diagrams of the bifunctional linking compound used: d) 4T, e) 8PAP, PDP (top) and FDP (bottom).
Figure 30B:
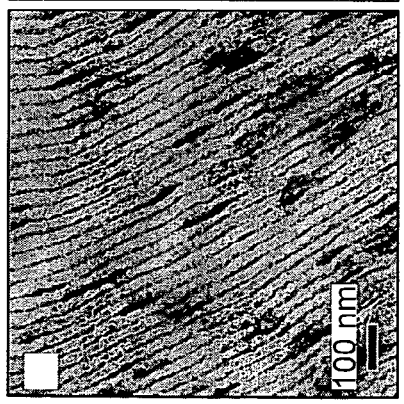
Figure 30C:
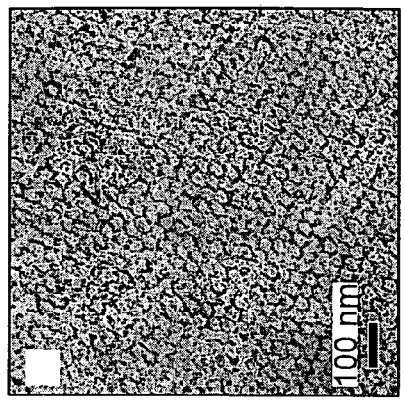
Figure 30D:
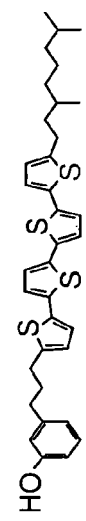
Figure 30E:
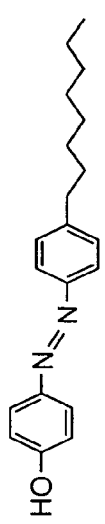
Figure 30F:
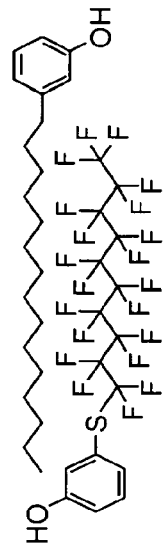
Figure 31B:
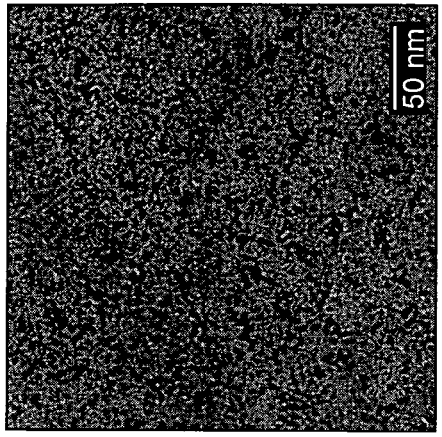
FIG. 31 Nanocomposites composed of PS-b-P4VP (ChHP)r with 2% by volume CdSe nanodots. a) SAXS profiles showing incorporation of the nanoparticles into the composite. b) and c) TEM images of two regions for the sample with r=1.
Figure 31C:
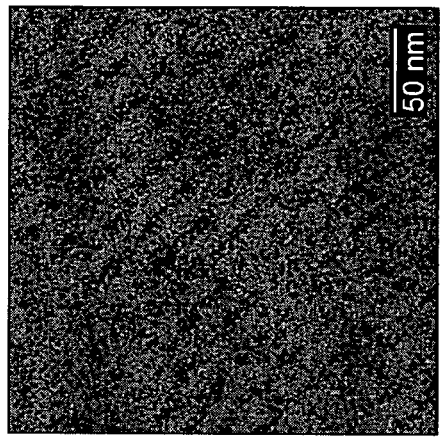
Figure 31A:
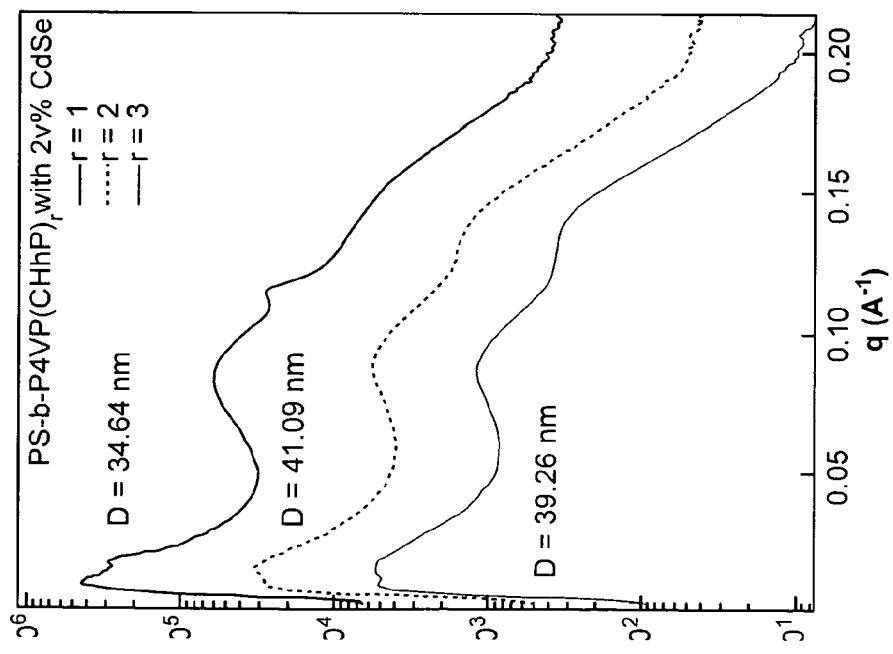

Direct NP Assemblies Using Light-responsive Bifunctional Linking Compounds 4-(4'-Octylphenyl)azophenol (OPAP) goes through a trans-cis isomerization upon exposure to UV light at 352 nm and a cis-trans isomerization at 419 nm. FIG. 25 shows the chemical structures of the supramolecule, PS-b-P4VP (OPAP)$_1$, constructed using OPAP in a trans- and cis-state, respectively. OPAP in the trans-state was used to construct the supramolecule, PS(40)-b-P4VP(5.6)(trans-OPAP)$_{1.5}$. Isomerization experiments were performed in a Rayonet RPR-100 photochemical reactor. PS(40)-b-P4VP(5.6)(trans-OPAP)$_{1.5}$ samples were sealed in quartz capillaries and exposed to $\lambda_{max}$=352 nm (trans- to cis-) or $\lambda_{max}$=419 nm (cis-to-trans) UV light while being heated to 115-125° C. for 1 hour and subsequently fan cooled to room temperature over 20 minutes. FIG. 27 shows (a) the TEM image and (b) SAXS of PS(40)-b-P4VP(5.6)(trans-OPAP)$_{1.5}$, confirming a lamellae-within-lamellae hierarchical assembly. Upon the trans-cis isomerization, diffraction peaks at low q region corresponding to the BCP morphology disappeared as seen in FIG. 27(b). This may be due to the contrast matching between the PS and P4VP(5.6)(trans-OPAP)$_{1.5}$microdomains. However, diffraction peak from the P4VP(5.6)(0PAP)$_{1.5}$ comb block assembly can be still seen and the trans-cis isomerization induced a ~0.3 nm reduction in the lamellar periodicity.

Upon blending with ~7 nm PbS NPs (~2% vol.), OPDP directed the PbS NP assembly similar to what was seen using PDP. The trans-cis isomerization of OPAP induced a change in the periodicity of the PbS NP assemblies from 37.4 nm to 32.9 nm. This is a difference of 4.5 nm or ~12% of the original lamellar spacing. The trans-cis isomerization also lead to a ~0.6 nm reduction in the lamellar assembly of the P4VP(5.6)

Figure 26:
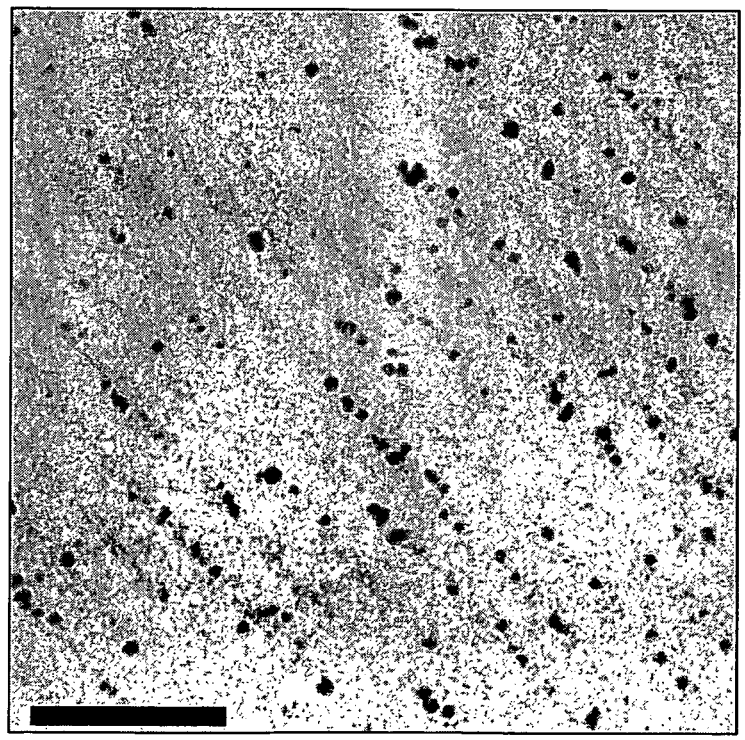
FIG. 26 TEM image of a blend of PS(40)-b-P4VP(5.6)(cis-OPAP)$_{1.5}$ and ~7 nm PbS NPs (~2 vol %) where OPAP went through a trans-cis isomerization. Clusters of NPs formed as shown in the circled region. (Scale bar: 100 nm).

(OPAP)$_{1.5}$ comb block. With subsequent annealing under UV exposure at 419 nm, the cis-trans isomerization changed the NP assembly back. In the PS(40)-b-P4VP(5.6)(OPAP)$_{1.5}$/PbS blend, the TEM image in FIG. 26 shows that the PbS NPs remained in a lamellar morphology upon transforming the OPAP to a cis-state. However, the ordering of the PbS NPs reduced and the NPs appeared to form small clusters. This qualitatively agrees with the SAXS profiles shown in FIG. 6(c).

Example 7

Blend of PS(40)-b-P4VP(5.6)(PDP)$_2$ and ~4 nm CdS Nanoparticles (Nanorods)

A blend was prepared according to the methods above using CdS nanoparticles having a diameter of about 4 nm and a length of between 20 and 100 nm, with PS(40)-b-P4VP(5.6)(PDP)$_2$.

Example 8

Blend of PS-b-P4VP(PDP)$_2$ and ~4 nm CdSe Nanoparticles

To prepare TEM samples for FIG. 5(d), the blend of PS-b-P4VP(PDP)$_2$ and ~4 nm CdSe NPs were first heated to 110° C. and quenched by dipping into liquid N2.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference in their entirety for all purposes.

What is claimed is:

1. A composition comprising:
a plurality of nanoparticles each having a ligand linked to a surface of each of the nanoparticles;
a plurality of block copolymers, each block copolymer comprising a first block and a second block; and
a plurality of bifunctional linking compounds, each bifunctional linking compound non-covalently links to one block of one of the block copolymers and to the ligand on the surface of each of the nanoparticles, wherein the plurality of nanoparticles are arranged in an array to form a first micro-domain, and the block copolymers form a second micro-domain, and the composition is a solid below the glass transition temperature of the plurality of block copolymers.

2. The composition of matter of claim 1, wherein the nanoparticles are selected from the group consisting of a metal, a semiconductor, a magnetic material, a metal chalcogenide, a metal oxide, and a combination thereof.

3. The composition of matter of claim 1, wherein the nanoparticles are selected from the group consisting of CdS, CdSe, PbS, Au, and CoFe$_2$O$_4$.

4. The composition of matter of claim 1, wherein the nanoparticles are selected from the group consisting of quantum dots, spherical and pseudo-spherical particles, faceted particles, nanorods, nanowires, tetrapods, anisotropic particles, and a combination thereof.

5. The composition of matter of claim 1, wherein the ligand covers the surface of the nanoparticles.

6. The composition of matter of claim 1, wherein the second block of the block copolymer comprises a hydrogen-bond acceptor.

7. The composition of matter of claim 1, wherein the block copolymer comprises polystyrene-block poly-4-vinylpyridine (PS-b-P4VP).

8. The composition of matter of claim 1, wherein the bifunctional linking compound comprises a hydrogen-bond donor selected from the group consisting of OH, NH$_2$ and SH.

9. The composition of matter of claim 1, wherein the bifunctional linking compound comprises a member selected from the group consisting of $C_{6-20}$ alkyl and $C_{6-20}$ haloalkyl.

10. The composition of matter of claim 1, wherein the bifunctional linking compound is selected from the group consisting of 3-n-pentadecylphenol (PDP), 4-(4'-Octylphenyl)azophenol (OPAP), 5'''-(3,7-dimethyloctyl)-5-(3-(3-hydroxyphenyl)propyl)-[2,2';5',2'';5'',2'''] quaterthiophene (4T), 4-(3,3,4,4,5,5,6,6,7,7,8,8,9,9,10,10,10-heptadecafluorodecylthio)phenol (FDP) and (8S,9S,10R,13R,14S,17R)-10,13-dimethyl-17-((R)-6-methylheptan-2-yl)-2,3,4,7,8,9,10,11,12,13,14,15,16,17-tetradecahydro-1H-cyclopenta[a]phenanthren-3-yl (3-hydroxyphenyl) succinate (ChHP).

11. The composition of matter of claim 1, wherein the bifunctional linking compound is selected from the group consisting of 3-n-pentadecylphenol (PDP) and 4-(4'-Octylphenyl)azophenol (OPAP).

12. The composition of matter of claim 1, wherein the bifunctional linking compound is selected from the group consisting of octadecylphosphonic acid and oleic acid.

13. The composition of matter of claim 1, wherein the array comprises a one dimensional array.

14. The composition of matter of claim 13, wherein the nanoparticles are arranged in a closed packed structure in the one dimensional array.

15. The composition of matter of claim 1, wherein the array comprises a two dimensional array.

16. The composition of matter of claim 1, wherein the array comprises a three dimensional array.

17. The composition of matter of claim 1, wherein the second micro-domain forms a matrix that separates a plurality of first micro-domains from each other.

18. A method of making a nanocomposite comprising:
forming a solution of a plurality of block copolymers each comprising a first block and a second block, a plurality of bifunctional linking compounds, and a plurality of nanoparticles; and
annealing the solution to produce the nanocomposite comprising:
the plurality of nanoparticles each having a ligand linked to a surface of each nanoparticle;
the plurality of block copolymers; and
the plurality of bifunctional linking compounds that non-covalently link to one block of one of the block copolymers and to the ligand on the surface of each of the plurality of nanoparticles, wherein the plurality of nanoparticles are arranged in an array to form a first micro-domain, and the plurality of block copolymers form a second micro-domain, and the nanocomposite is a solid below the glass transition temperature of the plurality of block copolymers.

19. The method of claim 18 wherein annealing the solution comprises a solvent anneal.

20. The method of claim 18 wherein annealing the solution comprises a thermal anneal.

* * * * *